US012732718B2

(12) United States Patent
Shim

(10) Patent No.: US 12,732,718 B2
(45) Date of Patent: Sep. 8, 2026

(54) IMAGE SENSOR

(71) Applicant: SAMSUNG ELECTRONICS CO., LTD., Suwon-si (KR)

(72) Inventor: Eunsub Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 18/198,882

(22) Filed: May 18, 2023

(65) Prior Publication Data

US 2024/0064436 A1 Feb. 22, 2024

(30) Foreign Application Priority Data

Aug. 18, 2022 (KR) ........................ 10-2022-0103336

(51) Int. Cl.

*H04N 25/771* (2023.01)
*H04N 25/59* (2023.01)
*H04N 25/704* (2023.01)
*H04N 25/772* (2023.01)
*H04N 25/778* (2023.01)

(Continued)

(52) U.S. Cl.

CPC ........... *H04N 25/771* (2023.01); *H04N 25/59* (2023.01); *H04N 25/704* (2023.01); *H04N 25/772* (2023.01); *H04N 25/778* (2023.01); *H04N 25/79* (2023.01); *H10F 39/18* (2025.01); *H10F 39/802* (2025.01); *H10F 39/803* (2025.01); *H10F 39/8037* (2025.01);

(Continued)

(58) Field of Classification Search

CPC .... H04N 25/771; H04N 25/59; H04N 25/704; H04N 25/772; H04N 25/778; H04N 25/79; H10F 39/803; H10F 39/8037; H10F 39/18; H10F 39/802; H10F 39/8057; H10F 39/8063; H10F 39/811; H10F 39/1865

See application file for complete search history.

(56) References Cited

U.S. PATENT DOCUMENTS 10,440,301 B2 10/2019 Li et al.
11,025,844 B2 6/2021 Seo et al.

(Continued)

FOREIGN PATENT DOCUMENTS

JP 2021-158313 10/2021
KR 10-2020-0098764 A 8/2020
KR 10-2022-0142737 10/2022

OTHER PUBLICATIONS

First Office Action issued Jan. 30, 2026 in corresponding Korean Patent Application No. 10-2022-0103336.

*Primary Examiner* — Twyler L Haskins
*Assistant Examiner* — Akshay Trehan
(74) *Attorney, Agent, or Firm* — Morgan, Lewis & Bockius LLP

(57) ABSTRACT

An image sensor including: a plurality of first photoelectric conversion elements included in a first region of a pixel; a plurality of second photoelectric conversion elements included in a second region of the pixel; a first overflow capacitor connected to the plurality of first photoelectric conversion elements to store overflow charges of the first photoelectric conversion elements; a second overflow capacitor connected to the plurality of second photoelectric conversion elements to store overflow charges of the second photoelectric conversion elements; and one or more micro-lenses disposed on the pixel.

20 Claims, 21 Drawing Sheets

(51) Int. Cl.

| | |
|---|---|
| ***H04N 25/79*** | (2023.01) |
| ***H10F 39/00*** | (2025.01) |
| ***H10F 39/18*** | (2025.01) |

(52) U.S. Cl.

CPC ..... *H10F 39/8057* (2025.01); *H10F 39/8063* (2025.01); *H10F 39/811* (2025.01); *H10F 39/1865* (2025.01)

(56) References Cited

U.S. PATENT DOCUMENTS

| | | | | |
|---|---|---|---|---|
| 11,201,186 | B2 | 12/2021 | Tanaka et al. | |
| 2010/0208115 | A1* | 8/2010 | Sugawa | H04N 25/771 348/308 |
| 2019/0252432 | A1* | 8/2019 | Onuki | H04N 25/587 |
| 2020/0260025 | A1* | 8/2020 | Seo | H04N 25/59 |
| 2021/0120168 | A1 | 4/2021 | Shim et al. | |
| 2021/0136303 | A1 | 5/2021 | Kim et al. | |
| 2021/0144321 | A1* | 5/2021 | Yamashita | H04N 25/704 |
| 2021/0250530 | A1 | 8/2021 | Paik et al. | |
| 2021/0337144 | A1 | 10/2021 | Wang et al. | |
| 2021/0383555 | A1 | 12/2021 | Shin et al. | |
| 2022/0337777 | A1 | 10/2022 | Shim et al. | |
| 2024/0163587 | A1* | 5/2024 | Asahi | H04N 25/134 |

* cited by examiner 100
110
PX
RL
SEL
TS
RS
DCS
DRMS
BST
DRMGS
CL
130
131
ADC CIRCUIT
DATA BUS
132
IDT
190
SIGNAL PROCESSOR
120
ROW DRIVER
140
RAMP SIGNAL GEN.
RAMP
150
TIMING CONTROLLER

DSW_S
SEL
RS
DCS
DRMGS_1
DRMGS_2
TS

T1'
T2'
T3'
T4'
T5'

B

DSW_S
SEL
RS
DCS
DRMGS_1
DRMGS_2
TS

DSW_S
SEL
RS
DCS
DRMGS_1
DRMGS_2
TS

T1'
T2'
T3'
T4'
T5'

DSW_S
SEL
RS
DCS
DRMGS_1
DRMGS_2
TS

T1'
T2'
T3'
T4'
T5'

IMAGE SENSOR

CROSS-REFERENCE TO RELATED APPLICATION

This application claims priority under 35 U.S.C. § 119 to Korean Patent Application No. 10-2022-0103336, filed on Aug. 18, 2022, in the Korean Intellectual Property Office, the disclosure of which is incorporated by reference herein in its entirety.

TECHNICAL FIELD

The inventive concept relates to an image sensor.

DISCUSSION OF RELATED ART

The image sensor is a type of sensor that utilizes a semiconductor to convert light into an electrical signal. It consists of a pixel array made up of numerous pixels and a logic circuit responsible for driving the array and creating an image. This sensor may also include an autofocus function to help focus on a specific subject. Recently, a new technique has been developed to enhance the dynamic range of the image sensor by adding a dynamic random access memory (DRAM) capacitor to a floating diffusion (FD) node.

SUMMARY

The inventive concept provides a pixel with the ability to perform an autofocus function in an image sensor. This is achieved by connecting a capacitor to a floating diffusion node.

According to an embodiment of the inventive concept, there is provided an image sensor including: a plurality of first photoelectric conversion elements included in a first region of a pixel; a plurality of second photoelectric conversion elements included in a second region of the pixel; a first overflow capacitor connected to the plurality of first photoelectric conversion elements to store overflow charges of the first photoelectric conversion elements; a second overflow capacitor connected to the plurality of second photoelectric conversion elements to store overflow charges of the second photoelectric conversion elements; and one or more microlenses disposed on the pixel.

According to an embodiment of the inventive concept, there is provided an image sensor including a pixel array in which a plurality of pixels are arranged, wherein the pixel array includes: first pixels including a plurality of sub-pixels; and one or more auto focusing (AF) pixels including a plurality of sub-pixels, wherein one microlens is disposed above the AF pixel, wherein photodiodes corresponding to a first sub-pixel included in the AF pixel are electrically connected to a transfer circuit included in the AF pixel, wherein the transfer circuit comprises an overflow capacitor for storing overflow charges of the photodiodes corresponding to the first sub-pixel.

According to an embodiment of the inventive concept, there is provided an image sensor including a pixel array including one or more AF pixels, wherein a microlens is disposed on the AF pixel, wherein the AF pixel includes: a plurality of photodiodes corresponding to a plurality of sub-pixels included in the AF pixel; a plurality of transfer transistors configured to transfer photocharges of the plurality of photodiodes to a transfer circuit: and the transfer circuit including an overflow capacitor for storing overflow charges of the plurality of photodiodes, wherein overflow charges of a photodiode included in a region corresponding to a first region of the microlens, and overflow charges of a photodiode included in a region corresponding to a second region of the microlens are processed independently of each other.

BRIEF DESCRIPTION OF THE DRAWINGS

Embodiments of the inventive concept will be more clearly understood from the following detailed description taken in conjunction with the accompanying drawings in which:

FIGS. 11A and 11B are timing diagrams for explaining the operation of an AF pixel according to an embodiment of the inventive concept.

DETAILED DESCRIPTION OF THE EMBODIMENTS

Figure 1:
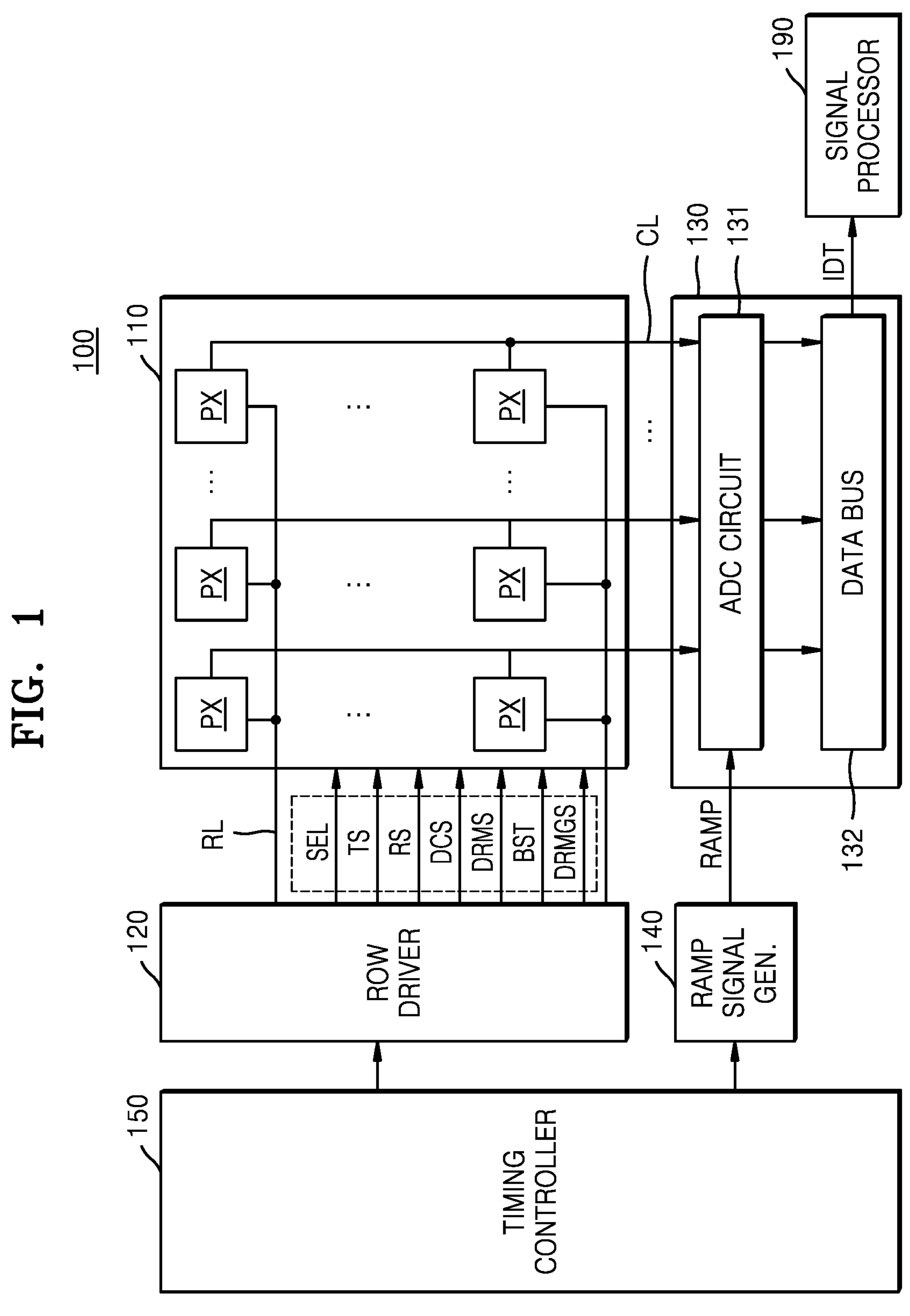
FIG. 1 is a block diagram illustrating an image sensor according to an embodiment of the inventive concept.

Hereinafter, various embodiments of the inventive concept will be described with reference to the accompanying drawings. In the drawings, like reference numerals may refer to like elements.

FIG. 1 is a block diagram illustrating an image sensor according to an embodiment of the inventive concept.

An image sensor 100 may be mounted on an electronic device having an image or light sensing function. For example, the image sensor 100 may be mounted on electronic devices such as cameras, smartphones, wearable devices, Internet of Things (IoT) devices, home appliances, tablet Personal Computers (PCs), Personal Digital Assistants (PDAs), Portable Multimedia Players (PMPs), navigators, drones, and Advanced Drivers Assistance Systems (ADAS). In addition, the image sensor 100 may be mounted on an electronic device provided as a component for vehicles, furniture, manufacturing facilities, doors, various measuring devices, and the like.

Referring to FIG. 1, the image sensor 100 may include a pixel array 110, a row driver 120, a readout circuit 130, a ramp signal generator 140, a timing controller 150, and a signal processor 190. The readout circuit 130 may include an analog-to-digital conversion circuit 131 (ADC circuit) and a data bus 132.

The pixel array 110 includes a plurality of row lines RL, a plurality of column lines CL, and a plurality of pixels PX connected to the plurality of row lines RL and the plurality of column lines CL, and arranged in a matrix. The plurality of pixels PX may be an active pixel sensor (APS).

Each pixel PX may include at least one photoelectric conversion element. The pixel PX may sense light using a photoelectric conversion element and may output an image signal that is an electrical signal according to the sensed light. For example, the photoelectric conversion element may be a photo-sensing element made of an organic material or an inorganic material, such as inorganic photodiodes, organic photodiodes, perovskite photodiodes, photo transistors, photo gates, or pinned photodiodes. In an embodiment, each pixel PX may include a plurality of photoelectric conversion elements.

A microlens for light collection may be disposed on the upper portion of each pixel PX or on each of pixel groups including adjacent pixels PX. Each of the plurality of pixels PX may detect light in a certain spectral range from light received through a microlens disposed thereon. For example, the pixel array 110 may include a red pixel for converting light in the red spectral range into an electrical signal, a green pixel for converting light in the green spectral range into an electrical signal, and a blue pixel for converting light in the blue spectrum range into an electrical signal. A color filter for transmitting light in a certain spectral range may be disposed above each of the plurality of pixels PX. However, the inventive concept is not limited thereto, and the pixel array 110 may include pixels that convert light in a spectral range other than red, green, and blue into electrical signals.

In an embodiment, the pixel PX may have a multi-layer structure. A multi-layered pixel PX includes a plurality of stacked photoelectric conversion elements that convert light in different spectral ranges into electrical signals, and electrical signals corresponding to different colors may be generated from a plurality of photoelectric conversion elements. In other words, electrical signals corresponding to a plurality of colors may be output from one pixel PX.

In the case where a color filter array for transmitting light in a certain spectral range is disposed on the plurality of pixels PX, a color detectable by the corresponding pixel PX may be determined according to the color filter disposed above each pixel PX. However, the inventive concept is not limited thereto. For example, in the case of a certain photoelectric conversion element, depending on the level of the electrical signal applied to the photoelectric conversion element, light in a certain wavelength band may be converted into an electrical signal.

In each pixel PX, charges generated by photoelectric conversion elements such as photodiodes may accumulate in a floating diffusion node, and the charge accumulated in the floating diffusion node may be converted into a voltage. In this case, a rate at which charges accumulated in the floating diffusion node are converted into voltage may be referred to as a conversion gain. The conversion gain may vary depending on the capacitance of the floating diffusion node.

For example, as the capacitance of the floating diffusion node increases, the conversion gain may decrease, and as the capacitance of the floating diffusion node decreases, the conversion gain may increase. The rate at which the charge is converted to a voltage is highest in the high conversion gain mode when the capacitance of the floating diffusion node is small, and lowest in a low conversion gain mode when the capacitance of the floating diffusion node is large.

The pixel array 110 may include at least one auto focusing (AF) pixel. The AF pixel may be a pixel having a circuit or a physical structure for autofocusing. In the present disclosure, the pixel PX included in the pixel array 110 may store charges that overflow from the photoelectric conversion element included in the pixel PX in a separate capacitor. The AF pixel included in the pixel array 110 may be a pixel used to auto-focus the pixel PX that stores the charge that overflows from the photoelectric conversion element in a separate capacitor. A detailed structure and operation method of the AF pixel according to an embodiment of the inventive concept will be described later.

In some embodiments, each pixel PX may operate in a single exposure method for performing one exposure or a multiple exposure method for performing multiple exposures. For example, the pixel PX may operate in a single exposure method in which pixel signals are generated through a photodiode after one exposure operation. As another example, the pixel PX may use a multiple exposure method, where it generates a pixel signal through a photodiode during a first exposure operation, and then generates an additional pixel signal through the same photodiode in response to a second exposure operation The timing controller 150 may control the timing of the row driver 120, the readout circuit 130, and the ramp signal generator 140. The timing controller 150 may provide control signals for controlling operation timing to each of the row driver 120, the readout circuit 130, and the ramp signal generator 140.

The row driver 120 may drive the pixel array 110 in units of row lines RL. The row driver 120 may select at least one row line RL from among the row lines RL constituting the pixel array 110. For example, the row driver 120 may generate a selection signal SEL for selecting one of the plurality of row lines RL. The pixel array 110 may output a pixel signal from the row line RL selected by the selection signal SEL. The pixel signal may include a reset signal and an image signal.

The row driver 120 may generate control signals for controlling the pixel array 110. For example, the row driver 120 may generate a transfer control signal TS for controlling a transfer transistor of the pixel PX, a reset control signal RS for controlling a reset transistor of the pixel PX; a DCG control signal DCS for controlling a DCG transistor of the pixel PX, a DRMG control signal DRMGS for controlling a DRMG transistor of the pixel PX, a DRAM control signal DRMS for controlling a transistor connected to both ends of a dynamic random access memory (DRAM) capacitor of the pixel PX, and a boosting signal BST for boosting a floating diffusion node of the pixel PX. The row driver 120 may provide control signals to the plurality of pixels PX in response to a timing control signal provided from the timing controller 150. The row driver 120 may determine activation and deactivation timings of control signals based on various operation modes (e.g., a high conversion gain mode).

The ramp signal generator 140 may generate a ramp signal RAMP that increases or decreases with a preset slope and provide the ramp signal RAMP to the ADC circuit 131 of the readout circuit 130.

The readout circuit 130 may read out a pixel signal from the pixels PX of the row line RL selected by the row driver 120 among the plurality of pixels PX. The readout circuit

130 converts the pixel signals received from the pixel array 110 through the plurality of column lines CL into digital data, based on the ramp signal RAMP provided from the ramp signal generator 140, such that pixel values corresponding to the plurality of pixels PX may be generated and output in a row unit.

The ADC circuit 131 may compare a pixel signal received through each column line CL with a ramp signal RAMP, and generate a pixel value that is a digital signal based on the comparison results. For example, the reset signal may be removed from the image signal, and a pixel value indicating the amount of light detected by the pixel PX may be generated. The ADC circuit 131 may sample and hold a pixel signal according to a Correlated Double Sampling (CDS) method, double-sample a certain noise level (e.g., a reset signal) and a level according to an image signal, and generate a comparison signal based on a level corresponding to the difference. The ADC circuit 131 may first read out the image signal and then read out the reset signal to sample the provided pixel signal according to a Delta Reset Sampling (DRS) method.

A plurality of pixel values generated by the ADC circuit 131 may be output as image data IDT through the data bus 132. The image data IDT may be provided to an image signal processor inside or outside the image sensor 100.

The data bus 132 may temporarily store pixel values output from the ADC circuit 131 and then output the stored pixel values. The data bus 132 may include a plurality of column memories and a column decoder. The plurality of pixel values stored in the plurality of column memories may be output as image data IDT under control by the column decoder.

The signal processing unit 190 may perform noise reduction processing, gain adjustment, waveform shaping processing, interpolation processing, white balance processing, gamma processing, edge enhancement processing, binning, and the like on image data. In some embodiments, the signal processing unit 190 may generate an output image by synthesizing image data output from the pixel array 110. In an embodiment, the signal processing unit 190 may be provided in an external processor of the image sensor 100.

Figure 2:
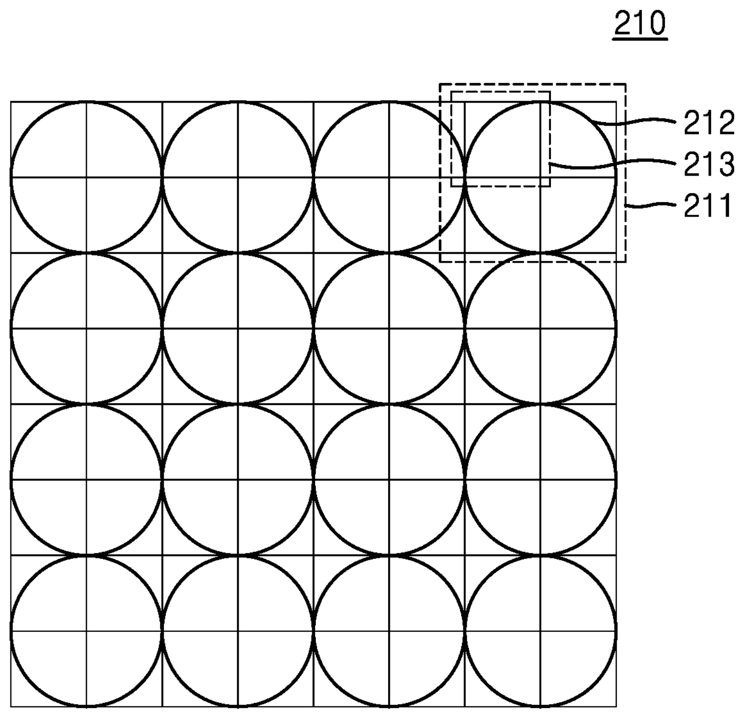
FIG. 2 is a diagram schematically illustrating a pixel array of an image sensor according to an embodiment of the inventive concept.

FIG. 2 is a diagram schematically illustrating a pixel array of an image sensor according to an embodiment of the inventive concept.

Referring to FIG. 2, the pixel array 210 may include a plurality of AF pixels 211 and microlenses 212 disposed respectively above the plurality of AF pixels 211. Each of the plurality of AF pixels 211 may include a plurality of sub-pixels 213. Referring to FIG. 2, one AF pixel 211 may include four sub-pixels 213, and one microlens 212 may be disposed in one AF pixel 211.

According to an embodiment of the inventive concept, it is assumed that the microlens 212 is provided with a size that may be disposed in one AF pixel 211 including four sub-pixels 213, but the inventive concept is not limited thereto. For example, one microlens 212 may be provided in a size including two sub-pixels 213 or may be provided in a size including eight sub-pixels 213.

In the present disclosure, for convenience of description, one sub-pixel is described as including one photoelectric conversion element, but it is to be understood that one sub-pixel may include a plurality of photoelectric conversion elements. Hereinafter, it is assumed that the photoelectric conversion element is a photodiode.

Figure 3A:
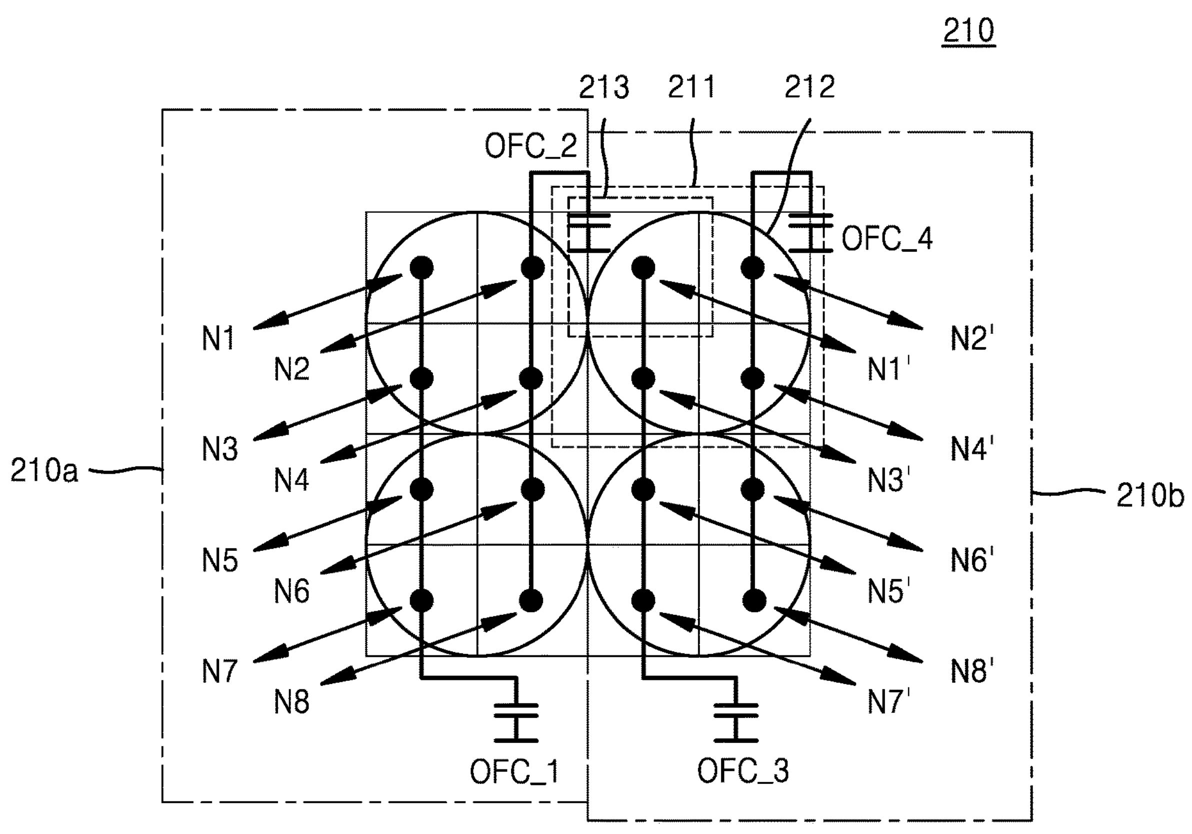
FIGS. 3A and 3B are diagrams illustrating a plan view and a circuit diagram of a pixel array according to an embodiment of the inventive concept.
Figure 3B:
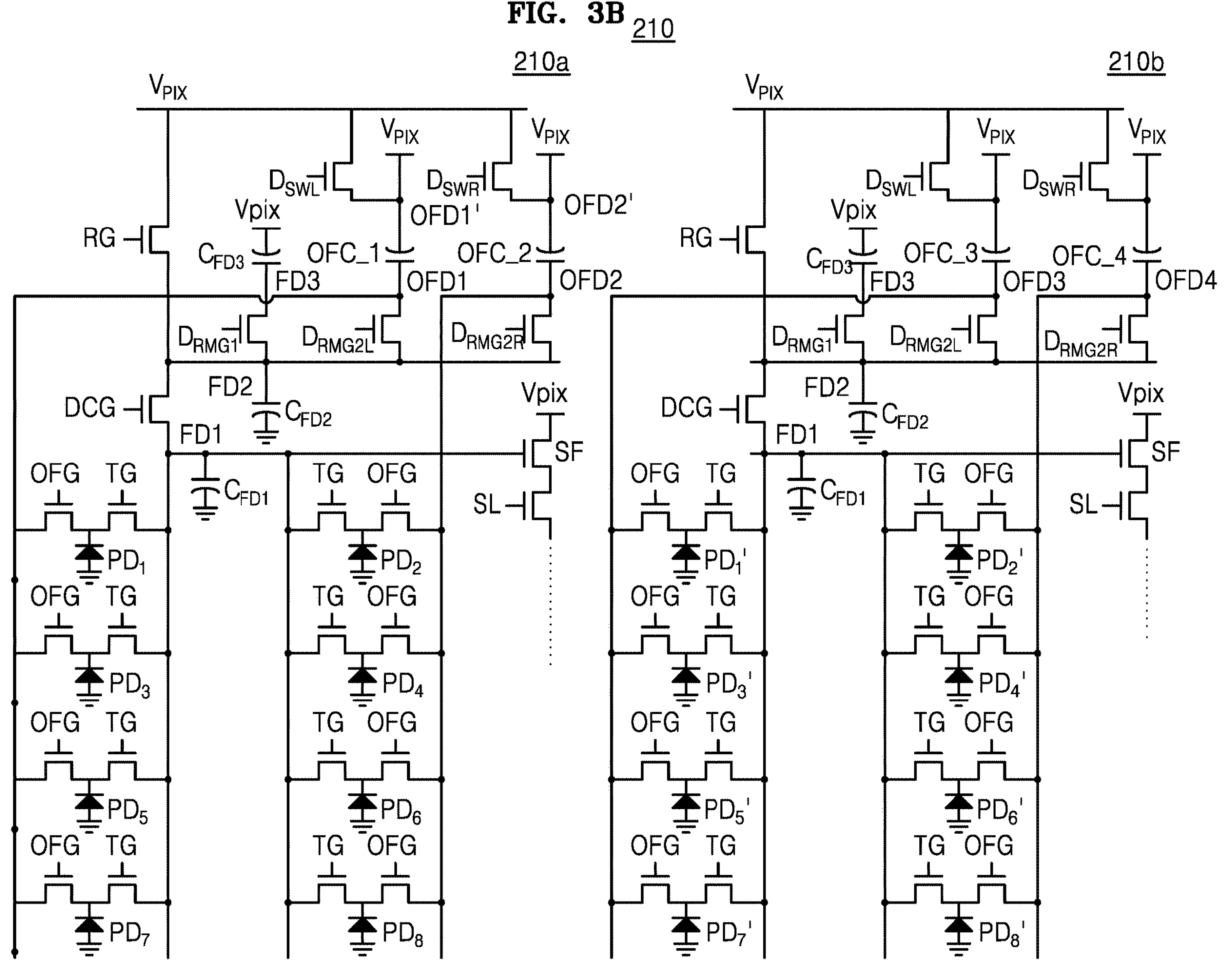

FIGS. 3A and 3B are diagrams illustrating a plan view and a circuit diagram of a pixel array according to an embodiment of the inventive concept.

Referring to FIG. 3A, a pixel array 210 including four microlenses 212 and four AF pixels 211 in which four sub-pixels 213 are disposed under each microlens 212 is shown. Referring to FIG. 3A, one microlens 212 may be disposed on an upper portion of four sub-pixels 213. One microlens 212 may be disposed on an upper portion of one AF pixel 211. According to an example, each of the sub-pixels 213 may include one photoelectric conversion element.

Referring to FIG. 3A, the photoelectric conversion elements included in each sub-pixel 213 may be connected to nodes N1 to N8 and N1' to N8', respectively. The photoelectric conversion elements included in each sub-pixel 213 may be connected to each other through nodes N1 to N8 and N1' to N8' corresponding to the sub-pixels 213.

Referring to FIG. 3A, the structure of the pixel array 210 in which nodes N1, N3, N5, and N7 are electrically connected to each other is disclosed. That the nodes N1, N3, N5, and N7 are electrically connected may mean that sub-pixels corresponding to each node are electrically connected to each other. Referring to FIG. 3A, nodes N2, N4, N6, and N8 are electrically connected to each other, nodes N1', N3', N5', and N7' are electrically connected to each other, and nodes N2', N4', N6', and N8' are electrically connected to each other.

Referring to FIG. 3A, sub-pixels corresponding to the respective nodes are electrically connected to each other as the nodes N1, N3, N5, and N7 are electrically connected to each other, and in addition to this, the pixel array 210 to which a first overflow capacitor OFC_1 is connected is disclosed. In other words, the nodes N1, N3, N5 and N7 are connected to the first overflow capacitor OFC_1. A second overflow capacitor OFC_2 may be connected to the nodes N2, N4, N6, and N8, a third overflow capacitor OFC_3 may be connected to the nodes N1', NY, N5', and N7', and a fourth overflow capacitor OFC_4 may be connected to the nodes N2, N4', N6', and N8'.

Referring to FIG. 3A, an example in which some sub-pixels among the plurality of sub-pixels 213 included in the microlens 212 are electrically connected to each other and the pixel array 210 includes the first to fourth overflow capacitors OFC_1 to OFC_4 that may respectively store the overflow charge of the photoelectric conversion element included in the corresponding sub-pixels is illustrated. According to an example, among the plurality of sub-pixels 213 included in the microlens 212, some sub-pixels corresponding to the left region of the microlens 212 may be connected to the first overflow capacitor OFC_1 and some sub-pixels corresponding to the right region of the microlens 212 may be connected to the second overflow capacitor OFC_2. Referring to FIG. 3A, in the pixel array 210 including the plurality of AF pixels 211, some of the sub-pixels 213 included in each AF pixel 211 and the remaining sub-pixels may be respectively connected to separate overflow capacitors.

Hereinafter, for convenience of explanation, it is assumed that the photoelectric conversion elements included in each sub-pixel respectively connected to the nodes N1 to N8 are $PD_1$ to $PD_8$ and the photoelectric conversion elements included in each sub-pixel respectively connected to the nodes N1' to N8' are $PD_1'$ to $PD_8'$. According to one example, the photoelectric conversion element included in the sub-pixel connected to the node N4 may be $PD_4$, and the photoelectric conversion element included in the sub-pixel connected to the node N5' may be $PD_5'$. The photoelectric conversion element shown in the circuit diagram of FIG. 3B may refer to a photoelectric conversion element included in a sub-pixel connected to the nodes shown in FIG. 3A.

Referring to FIG. 3B, a circuit diagram of the pixel array 210 of FIG. 3A is shown. The pixel array 210 of FIG. 3A may be provided as a 2×4 unit pixel. Referring to FIG. 3B, a transfer circuit may be configured for the unit pixels 210*a* and 210*b* including 8 sub-pixels in the 2×4 shape of FIG. 3A. According to one example, a unit pixel in the present disclosure may have a structure including at least two sub-pixels under one microlens, and may have a structure sharing the same transfer circuit. According to an example, a 2×4 unit pixel may indicate that one transfer circuit is included for each 2×4 unit pixel 210*a*. According to an example, the transfer circuit may refer to a portion of a circuit of a pixel except for a photodiode PD, a transfer transistor TG, and an overflow gate transistor OFG. The transfer circuit according to the present disclosure may refer to a circuit capable of storing an overflow charge of a photodiode connected to the transfer circuit, including an overflow capacitor. The configuration of the circuit diagram of FIGS. 3B, 4B, 7B, and 9B showing the transfer circuit may be an example, and one configuration of a circuit including a capacitor capable of storing an overflowed electric charge may be applied.

Referring to FIG. 3A, since the pixel array 210 provided with two 2×4 unit pixels is disclosed, referring to FIG. 3B, two circuit diagrams 210*a* and 210*b* corresponding thereto may be illustrated. In the present disclosure, the unit pixel refers to a pixel array including 2×4 sub-pixels, but the unit of the unit pixel may not be limited thereto. According to another example, the unit pixel may refer to a pixel array including 2×2 sub-pixels. Hereinafter, for convenience of description, it is assumed that the unit pixel is a pixel array including 2×4 sub-pixels.

The pixel array of FIG. 3A may include 16 sub-pixels and may have a structure including 16 photoelectric conversion elements. Since the circuit diagrams of the two unit pixels shown in FIG. 3B have the same structure, only the circuit diagram 210*a* on the left will be described.

FIG. 3B is a circuit diagram corresponding to the pixel array 210 corresponding to FIG. 3A. Referring to FIG. 3B, the unit pixel 210*a* may include a plurality of photodiodes $PD_1$ to $PD_8$. The unit pixel 210*a* may include a plurality of transistors, for example, a plurality of transfer transistors TG, a DCG transistor DCG, first to third DRMG transistors $D_{RMG1}$, $D_{RMG2L}$, and $D_{RMG2R}$, DRAM transfer transistors $D_{SWL}$ and $D_{SWR}$, a reset transistor RG, a driving transistor SF, a selection transistor SL, and an overflow gate transistor OFG, floating diffusion capacitors $C_{FD1}$, $C_{FD2}$, and $C_{FD3}$, and overflow capacitors OFC_1 and OFC_2. A plurality of control signals TS, DCS, DRMS, RS, BTS, and SEL may be applied to the pixel PX, and at least some of the control signals may be generated by the row driver 120.

The plurality of photodiodes $PD_1$ to $PD_8$ may generate photocharges that vary depending on light intensity. For example, the plurality of photodiodes $PD_1$ to $PD_8$ may generate electric charges, i.e., negatively charged electrons and positively charged holes, in proportion to the amount of incident light. The generated holes may flow to the ground voltage connected to the anode of the photodiode, and the generated electrons may accumulate in the photodiode. The photocharges generated by the plurality of photodiodes $PD_1$ to $PD_8$ are transmitted only to a first floating diffusion node FD1 to accumulate therein according to the switching of the plurality of transfer transistors TG, the DCG transistor DCG, and the first to third DRMG transistors $D_{RMG1}$, $D_{RMG2L}$, and $D_{RMG2R}$, such that the generated photocharges may be transmitted to the first floating diffusion node FD1 and a second floating diffusion node FD2 to accumulate therein. Alternatively, the generated photocharges may be transmitted and accumulate in the first to third floating diffusion nodes FD1 to FD3 and the overflow capacitors OFC_1 and OFC_2. A parasitic capacitor may be formed in each of the first to third floating diffusion nodes FD1 to FD3, or the floating diffusion capacitors $C_{FD1}$, $C_{FD2}$, and $C_{FD3}$ may be connected to the first to third floating diffusion nodes FD1 to FD3, respectively.

The unit pixel 210*a* may include a plurality of transfer transistors TG. Referring to FIG. 3B, the unit pixel 210*a* may include eight transfer transistors TG. One end of each of the plurality of transfer transistors TG may be connected to one of the plurality of photodiodes $PD_1$ to $PD_8$, and the other end of each of the plurality of transfer transistors TG may be connected to the first floating diffusion node FD1. The plurality of transfer transistors TG may be turned on or off in response to a transfer control signal TS received from the row driver 120. Accordingly, each of the plurality of transfer transistors TG may transfer the photocharges generated by the plurality of photodiodes $PD_1$ to $PD_8$ to the first floating diffusion node FD1.

The unit pixel 210*a* may include the DCG transistor DCG. One end of the DCG transistor DCG may be connected to the first floating diffusion node FD1, and the other end of the DCG transistor DCG may be connected to the second floating diffusion node FD2. The DCG transistor DCG may be turned on or off in response to the DCG signal DCS received from the row driver 120. Accordingly, the DCG transistor DCG may connect the first floating diffusion node FD1 and the second floating diffusion node FD2 to each other. As the first floating diffusion node FD1 and the second floating diffusion node FD2 are connected to one another, a capacitance may increase and a conversion gain may decrease.

The unit pixel 210*a* may include the first DRMG transistor $D_{RMG1}$. One end of the first DRMG transistor $D_{RMG1}$ may be connected to the second floating diffusion node FD2, and the other end of the first DRMG transistor $D_{RMG1}$ may be connected to the third floating diffusion node FD3. The first DRMG transistor $D_{RMG1}$ may be turned on or off in response to the DRMG signal DRMGS received from the row driver 120. Accordingly, the first DRMG transistor $D_{RMG1}$ may connect the second floating diffusion node FD2 and the third floating diffusion node FD3 to each other. As the second floating diffusion node FD2 and the third floating diffusion node FD3 are connected to each other, capacitance may increase and a conversion gain may decrease. In other words, when both the first DRMG transistor $D_{RMG1}$ and the DCG transistor DCG are turned on, the first to third floating diffusion nodes FD1 to FD3 may be connected to each other.

The conversion gain may be adjusted according to whether the DCG transistor DCG and the first DRMG transistor $D_{RMG1}$ are turned on or off.

The unit pixel 210*a* may include the second DRMG transistor $D_{RMG2L}$ and the third DRMG transistor $D_{RMG2R}$. One end of the second DRMG transistor $D_{RMG2L}$ may be connected to the second floating diffusion node FD2, and the other end of the second DRMG transistor $D_{RMG2L}$ may be connected to a first overflow floating diffusion node OFD1. The second DRMG transistor $_{DRMG2L}$ may be turned on or off in response to the DRMG signal DRMS received from the row driver 120. Accordingly, the second DRMG transistor DRMG2 may connect the second floating diffusion node FD2 and the first overflow floating diffusion node OFD1 to each other. One end of the third DRMG transistor $D_{RMG2R}$ may be connected to the second floating diffusion node FD2, and the other end of the third DRMG transistor $D_{RMG2R}$ may be connected to a second overflow floating diffusion node OFD2. The third DRMG transistor DFMG2R may be turned on or turned off in response to the DRMG signal DRMS received from the row driver 120. Accordingly, the third DRMG transistor DRMG3 may connect the second floating diffusion node FD2 and the second overflow floating diffusion node OFD2 to each other.

The unit pixel 210*a* may include the DRAM transfer transistors $D_{SWL}$ and $D_{SWR}$. One end of the DRAM transfer transistor $D_{SWL}$ may be connected to a pixel voltage $V_{PIX}$, and the other end of the DRAM transfer transistor $D_{SWL}$ may be connected to the third overflow floating diffusion node OFD1'. One end of the DRAM transfer transistor $D_{SWR}$ may be connected to the pixel voltage $V_{PIX}$, and the other end of the DRAM transfer transistor $D_{SWR}$ may be connected to a fourth overflow floating diffusion node OFD2'. The DRAM transfer transistors $D_{SWL}$ and $D_{SWR}$ may be turned on or off in response to a signal received from the row driver 120. According to an example, the overflow capacitors OFC_1 and OFC_2 may be reset using the DRAM transfer transistors $D_{SWL}$ and $D_{SWR}$, the second DRMG transistor $D_{RMG2L}$, and the third DRMG transistor $D_{RMG2R}$.

According to an embodiment of the inventive concept, charges may overflow from the photodiodes $PD_1$ to $PD_8$ by the exposure operation, and the overflowed charges may accumulate in the overflow capacitor OFC_1 or OFC_2. In other words, during the exposure operation, charges may overflow from the photodiodes $PD_1$ to $PD_8$ and accumulate in the overflow capacitors OFC_1 or OFC_2. The overflow capacitor OFC_1 or OFC_2 may be a DRAM capacitor.

Referring back to FIG. 3B, an overflow gate transistor OFG may be connected to each of the plurality of photodiodes $PD_1$ to $PD_8$. The overflow gate transistor OFG may control the flow of charges so that electrons flowing out due to overflow of each of the photodiodes $PD_1$ to $PD_8$ may be stored in the overflow capacitors OFC_1 and OFC_2. In other words, the overflow gate transistor OFG may control the flow of charges so that electrons that overflow from each of the photodiodes $PD_1$ to $PD_8$ can be stored in the overflow capacitors OFC_1 and OFC_2. Referring to FIG. 3B, a photodiode (any one of $PD_1$, $PD_3$, $PD_5$, and $PD_7$) may be connected to one end of the overflow gate transistor OFG, and the first overflow floating diffusion node OFD1 may be connected to the other end of the overflow gate transistor OFG. Referring to FIG. 3B, a photodiode (any one of $PD_2$, $PD_4$, $PD_6$, and $PD_8$) may be connected to one end of the overflow gate transistor OFG, and the second overflow floating diffusion node OFD2 may be connected to the other end of the overflow gate transistor OFG. According to an example, the overflow gate transistor OFG may be turned on to reset any one of the photodiodes $PD_1$ to $PD_8$ connected to the overflow gate transistor OFG. According to an example, the overflow gate transistor OFG may be turned off when any one of the photodiodes $PD_1$ to $PD_8$ connected to the overflow gate transistor OFG is reset.

Referring to FIGS. 3A and 3B together, the photodiodes $PD_1$, $PD_3$, $PD_5$, and $PD_7$ corresponding to the nodes N1, N3, N5, and N7 are connected to the first overflow floating diffusion node OFD1, such that the first overflow capacitor OFC1 may store the charges that overflow from the photodiodes $PD_1$, $PD_3$, $PD_5$, and $PD_7$. The photodiodes $PD_2$, $PD_4$, $PD_6$, and $PD_8$ corresponding to the nodes N2, N4, N6, and N8 are connected to the second overflow floating diffusion node OFD2, such that the second overflow capacitor OFC2 may store the charges that overflow from the photodiodes $PD_2$, $PD_4$, $PD_6$, and $PD_8$.

Referring to FIGS. 3A and 3B, the pixel array according to the inventive concept may include two or more overflow capacitors OFC_1 and OFC_2 located under one microlens. The pixel array may allow electrons flowing out from the overflow gate transistor OFG connected to the photodiode (e.g., $PD_1$) in one direction with respect to the microlens to enter the first overflow capacitor OFC_1, and may allow electrons flowing out of the overflow gate transistor OFG connected to the photodiode (e.g., $PD_2$) in the other direction to enter the second overflow capacitor OFC_2 through a connection.

In FIG. 3B, it is illustrated that the pixel voltage $V_{PIX}$ is commonly supplied to all transistors for convenience of explanation, but according to embodiments, the operating voltages supplied to each of the transistors included in the pixel array may be designed differently.

The unit pixel 210*a* may include the reset transistor RG. The reset transistor RG may reset charges accumulated in at least one of the first to third floating diffusion nodes FD1 to FD3. The pixel voltage $V_{PIX}$ may be applied to one end of the reset transistor RG, and the other end of the reset transistor RG may be connected to the second floating diffusion node FD2. In another embodiment, a voltage other than the pixel voltage $V_{PIX}$ may be applied to one end of the reset transistor RG. The reset transistor RG may be turned on or off in response to the reset control signal RS received from the row driver 120. Accordingly, charges accumulated in at least one of the first to third floating diffusion nodes FD1 to FD3 and the first to second overflow floating diffusion nodes OFD1 and OFD2 are discharged, such that at least one of the first to third floating diffusion nodes FD1 to FD3 and the first to second overflow floating diffusion nodes OFD1 and OFD2 may be reset.

The unit pixel 210*a* may include the driving transistor SF. One end of the driving transistor SF may be connected to the selection transistor SL, and the pixel voltage $V_{PIX}$ may be applied to the other end of the driving transistor SF. The driving transistor SF may operate as a source follower based on a bias current generated by a current source connected to the column line CL. The driving transistor SF may output a voltage corresponding to a charge accumulated in at least one of the first to third floating diffusion nodes FD1 to FD3 as a pixel signal.

The unit pixel may include a selection transistor SL. One end of the selection transistor SL may be connected to the driving transistor SF, and the other end of the selection transistor SL may be connected to the column line CL. The selection transistor SL may be turned on or off in response to the selection signal SEL received from the row driver 120. When the selection transistor SL is turned on in the readout operation, a pixel signal including a reset signal corresponding to a reset operation or an image signal corresponding to a charge accumulation operation may be output to the column line CL.

According to an embodiment of the inventive concept, charges generated in the photodiode PD may be accumulated using the first to third floating diffusion nodes FD1 to FD3 and the overflow capacitors OFC_1 and OFC_2.

According to the circuit of the pixel array 210 of FIG. 3B, the circuit may include a first overflow capacitor OFC_1 capable of storing overflow charges of the photodiodes $PD_1$, $PD_3$, $PD_5$, and $PD_7$, a second overflow capacitor OFC_2 capable of storing the overflow charges of the photodiodes $PD_2$, $PD_4$, $PD_6$, and $PD_8$, a third overflow capacitor OFC_3 capable of storing the overflow charges of the photodiodes $PD_1$', $PD_3$', $PD_5$', and $PD_7$'; and a fourth overflow capacitor OFC_4 capable of storing overflow charges of the photodiodes $PD_2$', $PD_4$', $PD_6$', and $PD_8$'.

According to the present disclosure, in a structure including at least two sub-pixels under one microlens, the photodiodes included in each of the at least two sub-pixels may be connected to different overflow capacitors. This arrangement enables the storage of overflow charge for each area where light enters from different directions through the microlens, thereby improving the auto-focus function.

Each of the circuits illustrated in FIGS. 3B to 5B may be an embodiment of a transfer circuit including an overflow capacitor that the pixel array may include. The component of the transfer circuit that may be included in the pixel array according to the present disclosure is not limited to the illustrated ones, and some components may be added or removed to or from the transfer circuit.

Figure 4A:
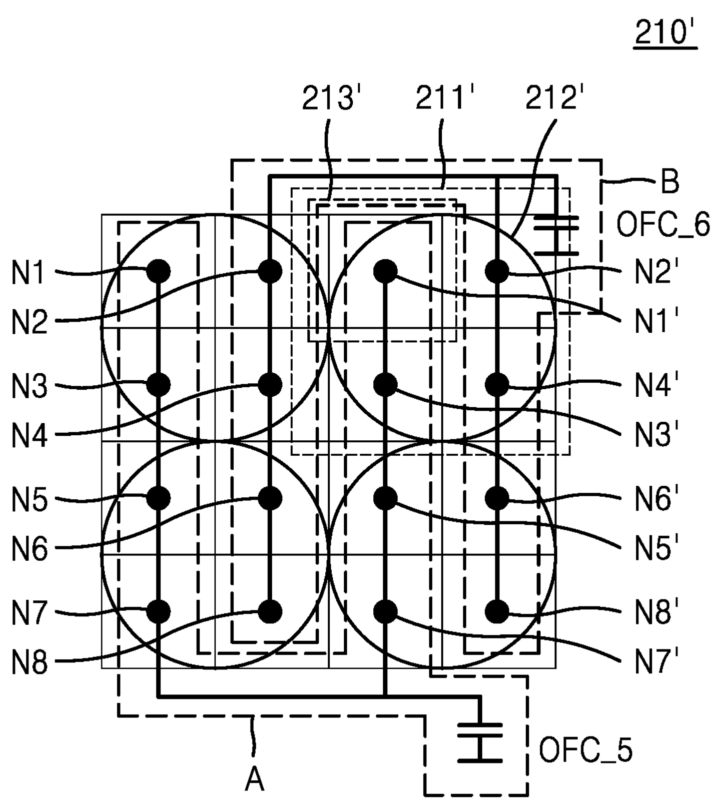
FIGS. 4A and 4B are diagrams illustrating a plan view and a circuit diagram of a pixel array according to an embodiment of the inventive concept.
Figure 4B:
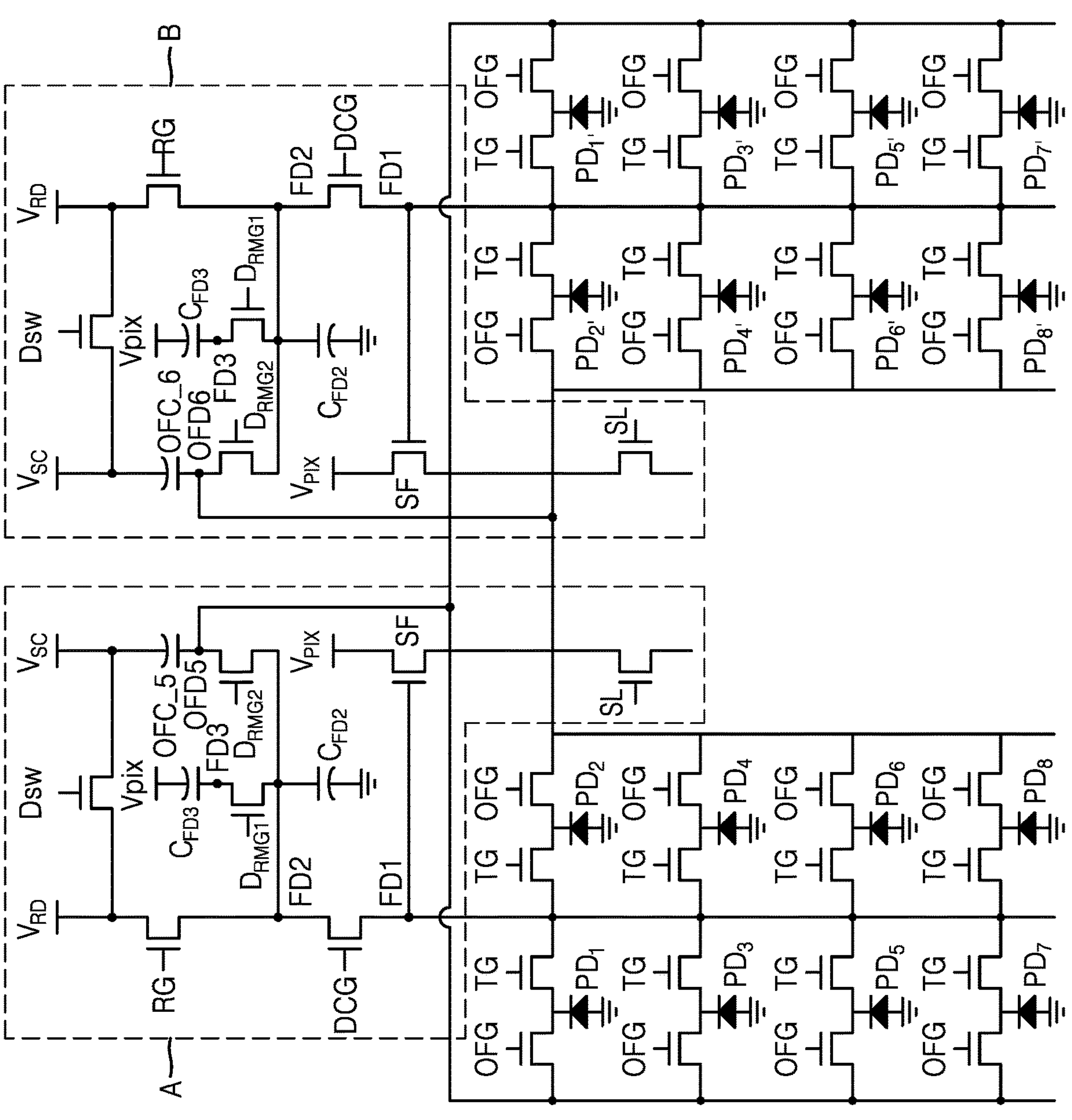

FIGS. 4A and 4B are diagrams illustrating a plan view and a circuit diagram of a pixel array according to an embodiment of the inventive concept.

In the description of FIGS. 4A to 4B, descriptions that are substantially the same as those of FIGS. 3A to 3B above are omitted. According to an example, the pixel array of FIG. 4A may include 16 sub-pixels like the pixel array of FIG. 3A. It is assumed that nodes corresponding to sub-pixels included in the pixel array of FIG. 4A are the same as those shown in FIG. 3A.

According to an example, in a pixel array 210' of FIG. 4A, nodes N1, N3, N5, N7, N1', N3', N5', and N7' may be electrically connected to each other, and an overflow capacitor OFC_5 may be additionally connected to the nodes N1, N3, N5, N7, N1', N3', N5', and N7'. In the pixel array 210' of FIG. 4A, nodes N2, N4, N6, N8, N2', N4', N6', and N8' may be electrically connected to each other, and an overflow capacitor OFC_6 may be additionally connected to the nodes N2, N4, N6, N8, N2', N4', N6', and N8'.

Referring to FIG. 4A, all sub-pixels located in the left region of a microlens 212' may be electrically connected to each other, which may be referred to as a region A. All sub-pixels located in the right region of the microlens 212' may be electrically connected to each other, which may be referred to as a region B. All sub-pixels located in the left region of the microlens 212' may be connected to the overflow capacitor OFC_5, and all sub-pixels located in the right region of the microlens 212' may be connected to the overflow capacitor OFC_6.

FIG. 4B is a circuit diagram of the pixel array according to FIG. 4A.

Referring to FIG. 4B, the photodiodes $PD_1$, $PD_3$, $PD_5$, $PD_7$, $PD_1$', $PD_3$', $PD_5$', and $PD_7$' corresponding to all sub-pixels located in the left region of the microlens 212' may each be connected to an overflow gate transistor OFG.

Referring to FIG. 4B, one end of the overflow gate transistor OFG may be connected to any one of photodiodes $PD_1$, $PD_3$, $PD_5$, $PD_7$, $PD_1$', $PD_3$', $PD_5$', and $PD_7$' and the other end of the overflow gate transistor OFG may be connected to overflow floating diffusion node OFD5. Referring to FIG. 4B, one end of the overflow gate transistor OFG may be connected to any one of photodiodes $PD_2$, $PD_4$, $PD_6$, $PD_8$, $PD_2$', $PD_4$', $PD_6$', and $PD_8$' and the other end of the overflow gate transistor OFG may be connected to overflow floating diffusion node OFD6. Referring to FIG. 4B, a circuit diagram of the region A, which is a circuit diagram of all sub-pixels located in the left region of the microlens 212', and a circuit diagram of the region B, which is a circuit diagram of all sub-pixels located in the right region of the microlens 212', are shown. The circuit diagram of the region A may include a fifth overflow capacitor OFC_5 capable of storing overflowed charges of all sub-pixels located in the left region of the microlens 212'. In other words, the fifth overflow capacitor OFC_5 is capable of holding overflow charges generated by all sub-pixels situated in the left section of the microlens 212'. The circuit diagram of the region B may include a sixth overflow capacitor OFC_6 capable of storing overflowed charges of all sub-pixels located in the right region of the microlens 212'. In other words, the sixth overflow capacitor OFC_6 is capable of holding overflow charges generated by all sub-pixels situated in the right section of the microlens 212'. The circuit diagram of the region A and the circuit diagram of the region B may be a transfer circuit. Referring to FIG. 4B, the photodiodes $PD_1$, $PD_3$, $PD_5$, $PD_7$, $PD_1$', $PD_3$', $PD_5$', and $PD_7$' corresponding to the sub-pixels located in the left region of the microlens 212' may store the overflowed charge in the overflow capacitor OFC_5. The photodiodes $PD_2$, $PD_4$, $PD_6$, $PD_8$, $PD_2$', $PD_4$', $PD_6$', and $PD_8$' corresponding to the sub-pixels located in the right region of the microlens 212' may store the overflowed charge in the overflow capacitor OFC_6.

Referring to FIG. 4B, the circuit structures of the region A and the region B may be the same. According to an example, the region A may include a DCG transistor DCG, a reset transistor RG, a driving transistor SF, a selection transistor SL, a DRMG1 transistor $D_{RMG1}$, and a DRMG2 transistor $D_{RMG2}$.

Compared with FIG. 3B, in FIG. 3B, there are two overflow capacitors corresponding to all sub-pixels corresponding to the left region of the microlens, but in the embodiment of FIG. 4B, there may be one overflow capacitor corresponding to all sub-pixels corresponding to the left region of the microlens. As shown in the embodiment of FIG. 4B, the pixel array contains fewer transistors compared to the embodiment of FIG. 3B, resulting in a reduced area.

Figure 5A:
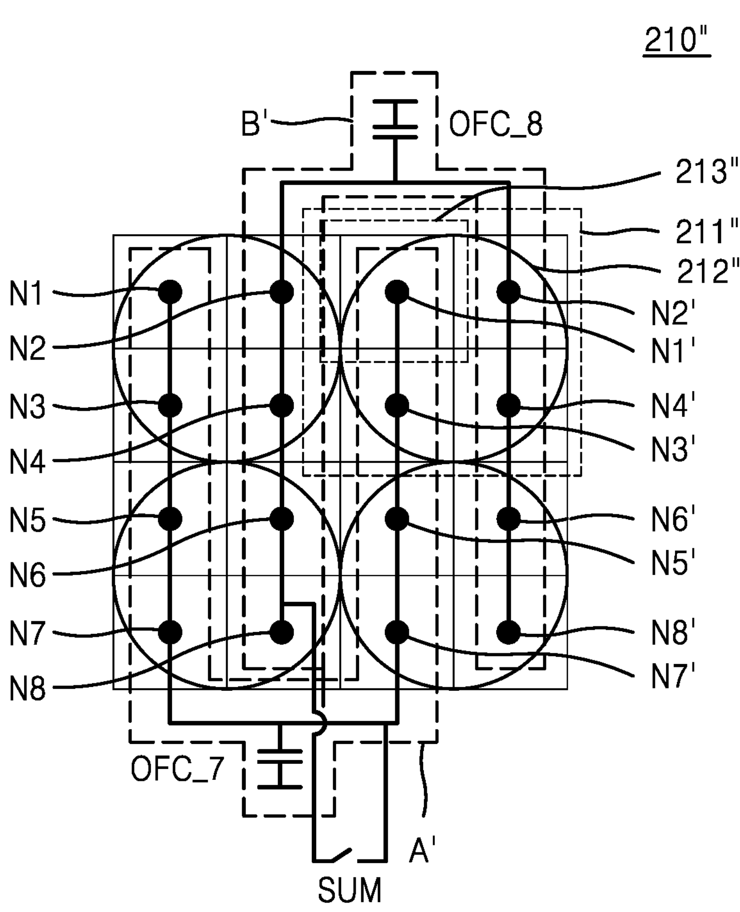
FIGS. 5A and 5B are diagrams illustrating a plan view and a circuit diagram of a pixel array according to an embodiment of the inventive concept.
Figure 5B:
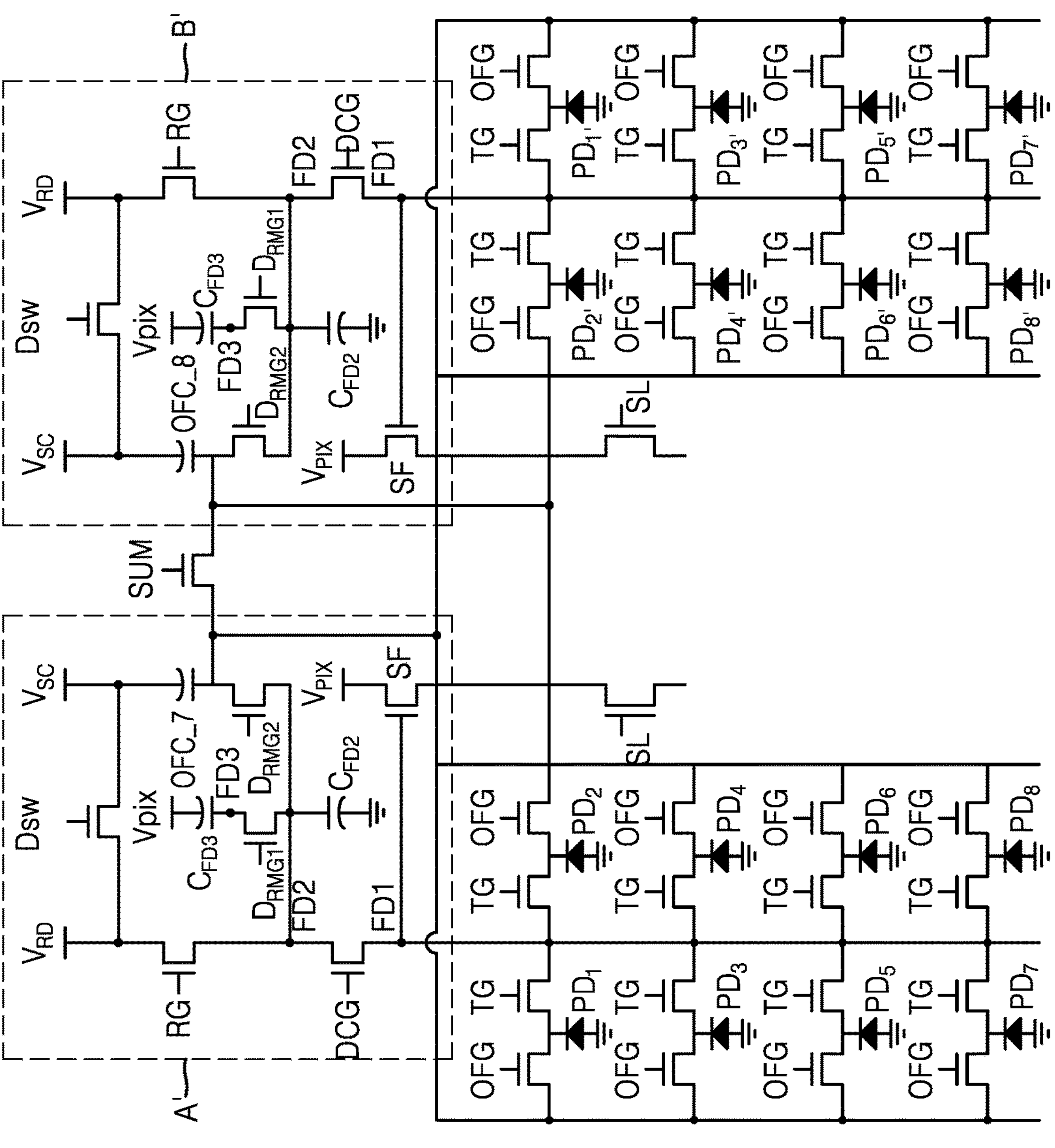

FIGS. 5A and 5B are diagrams illustrating a plan view and a circuit diagram of a pixel array according to an embodiment of the inventive concept.

In the description of FIGS. 5A to 5B, descriptions that are substantially the same as those of FIGS. 3A to 3B above are omitted. According to an example, the pixel array of FIG. 5A may include 16 sub-pixels like the pixel array of FIG. 3A. It is assumed that nodes corresponding to sub-pixels included in the pixel array of FIG. 5A are the same as those shown in FIG. 3A.

In a pixel array 210" of FIG. 5A, nodes N1, N3, N5, N7, N1', N3', N5', and N7' may be electrically connected to each other, and an overflow capacitor OFC_7 may be additionally connected to the nodes N1, N3, N5, N7, N1', N3', N5', and N7'. In the pixel array 210" of FIG. 5A, nodes N2, N4, N6, N8, N2', N4', N6', and N8' may be electrically connected to each other, and an overflow capacitor OFC_8 may be additionally connected to the nodes N2, N4, N6, N8, N2', N4', N6', and N8'. Referring to FIG. 5A, a circuit A' connecting sub-pixels arranged in the left region of the microlens and a circuit B' connecting sub-pixels arranged in a right region of the microlens may be connected through a switch SUM. According to an example, the switch SUM may be an n-type metal oxide semiconductor (NMOS) transistor.

Referring to FIG. 5B, all sub-pixels included in the pixel array 210" may be electrically connected through the switch SUM. According to one example, the overflow charge of the photodiodes included in the sub-pixels of the left region of a microlens 212" may be stored in overflow capacitor OFC_7, and the overflow charge of the photodiodes included in the sub-pixels of the right region of the microlens 212" may be stored in overflow capacitor OFC_8. According to the embodiment of FIG. 5B, the readout time may be reduced by connecting the output result of the unit pixel to the switch SUM. According to the embodiment of FIG. 5B, the reset level may be decreased by one level.

According to an example, the pixel array shown in FIGS. 3A to 5B may include AF pixels in all pixels. According to an example, autofocus may be performed by classifying sub-pixels included in an AF pixel corresponding to one microlens and connecting the sub-pixels to a separate overflow capacitor. In other words, autofocus can be achieved by grouping sub-pixels within an AF pixel associated with a single microlens and connecting the each sub-pixel group to a distinct overflow capacitor. According to an example, the sub-pixel corresponding to the left region of the microlens 212" and the sub-pixel corresponding to the right region of the microlens may be connected to different overflow capacitors. By doing this, the floating diffusion node included in the sub-pixels located in the left region of the microlens and the floating diffusion node included in the sub-pixels located in the right region of the microlens are not shared. According to an example, an overflow may not be formed between sub-pixels of the left region of the microlens and sub-pixels of the right region of the microlens. The use of the AF pixel according to an embodiment of the inventive concept enables the separate detection of overflow charges from the left and right regions of the microlens, facilitating efficient execution of the autofocus function. According to an embodiment of the present disclosure, for a pixel that includes a DRAM capacitor capable of storing overflow charge, it is possible to differentiate between overflow charges from photodiodes that correspond to the left or right directions of the microlens. This differentiation may be processed independently.

Figure 6:
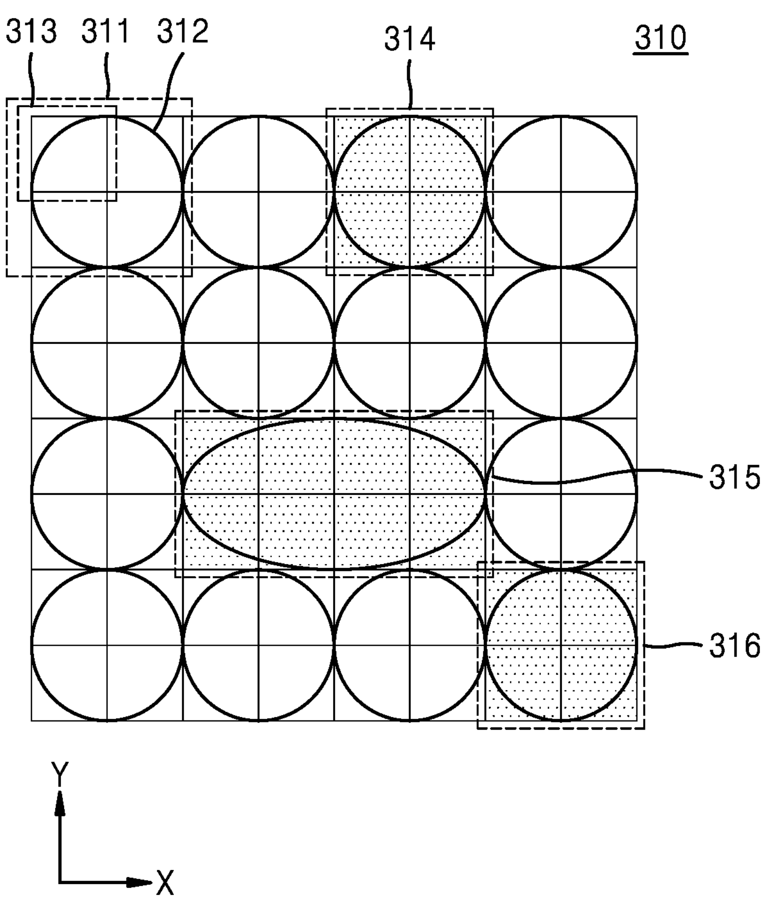
FIG. 6 is a diagram schematically illustrating a pixel array of an image sensor according to an embodiment of the inventive concept.

FIG. 6 is a diagram schematically illustrating a pixel array of an image sensor according to an embodiment of the inventive concept.

Referring to FIG. 6, a pixel array 310 of an image sensor according to an embodiment of the inventive concept may include a plurality of pixels 311, 314, 315, and 316 arranged in a first direction (X-axis direction) and a second direction (Y-axis direction). For example, the pixel array 310 may include a normal pixel 311, a first AF pixel 314, a second AF pixel 315, and a third AF pixel 316. Each of the normal pixel 311, the first AF pixel 314, the second AF pixel 315, and the third AF pixel 316 may be plural, and the number thereof may be variously modified. For example, the number of normal pixels 311 may be greater than the number of AF pixels 314, 315, and 316. In addition, the positions of the first AF pixel 314, the second AF pixel 315, and the third AF pixel 316 are not limited to those shown in FIG. 6 and may be variously modified. Each of the first AF pixel 314, the second AF pixel 315, and the third AF pixel 316 may include a first photodiode, a second photodiode, and a third photodiode. Like the first AF pixel 314, the second AF pixel 315, and the third AF pixel 316, the normal pixel 311 may include a plurality of photodiodes, or may include a single photodiode. The normal pixels 311 may include a plurality of sub-pixels. The normal pixels 311 may not generate AF information.

In the embodiment illustrated in FIG. 6, a plurality of lenses may be disposed in a path of light incident to the image sensor. An embodiment of the first AF pixel 314, the second AF pixel 315, and the third AF pixel 316 illustrated in FIG. 6 will be described in more detail with reference to FIGS. 7A to 9C.

Figure 7A:
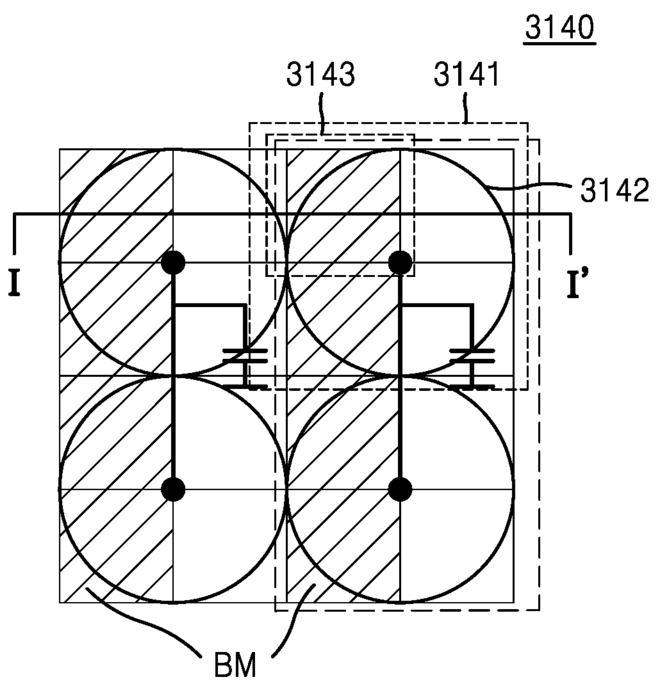
FIGS. 7A, 7B and 7C are diagrams illustrating a plan view, a circuit diagram, and a cross-sectional view of a pixel array according to an embodiment of the inventive concept.
Figure 7B:
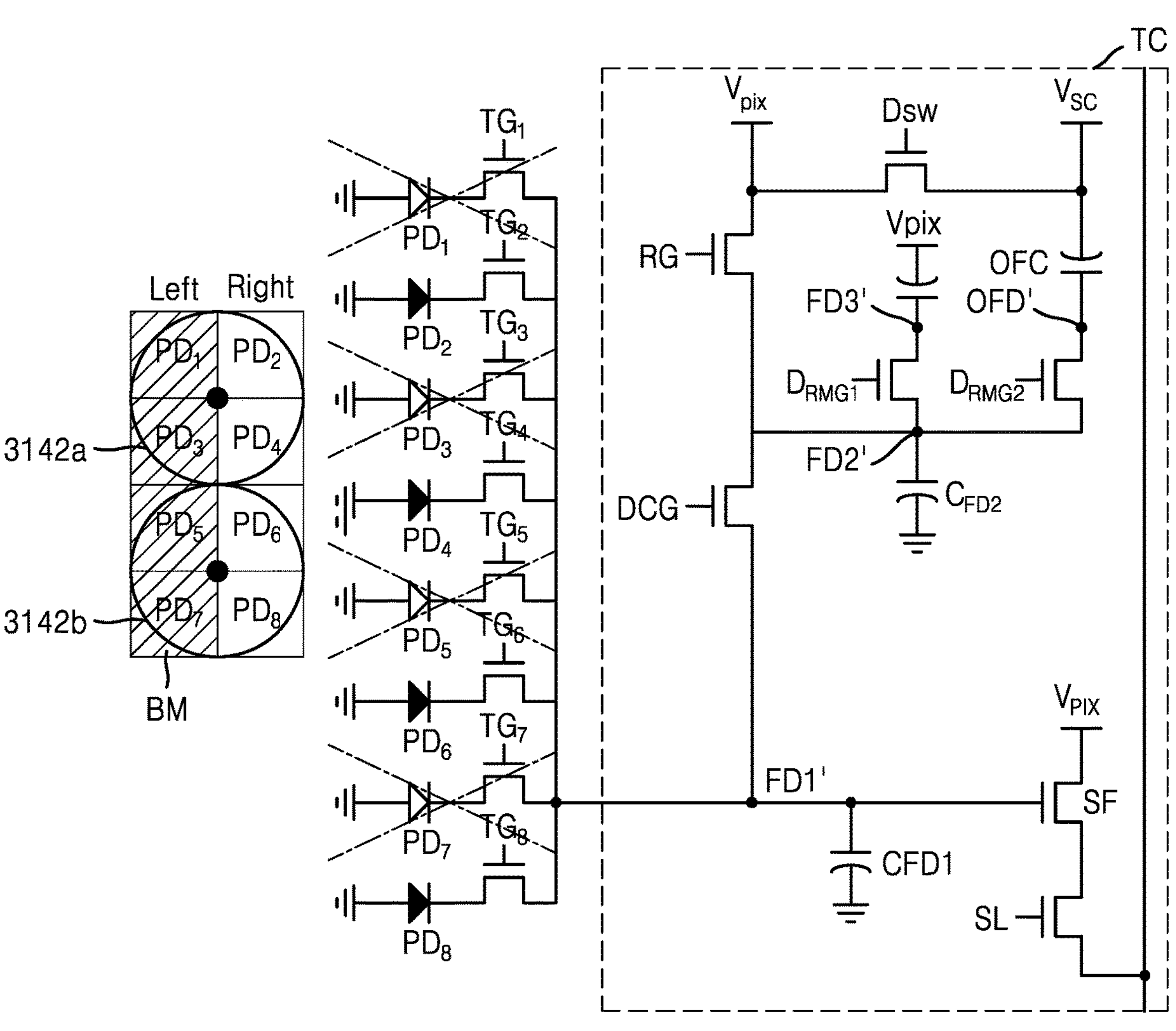
Figure 7C:
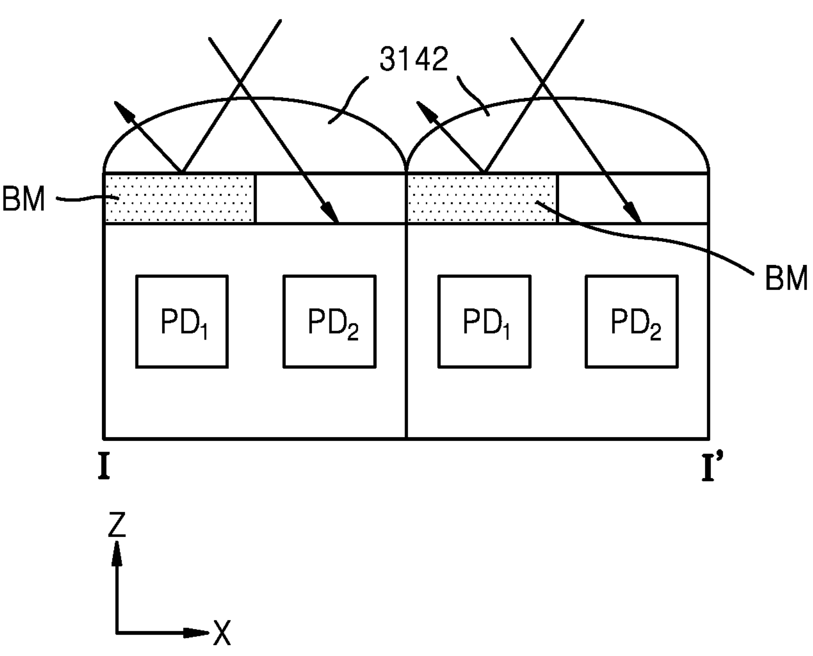

FIGS. 7A to 7C are diagrams illustrating a structure, a circuit diagram, and a cross-sectional view of a first AF pixel according to an embodiment of the inventive concept.

A unit pixel 3141 included in a pixel array 3140 of FIG. 7A may correspond to the first AF pixel 314 of FIG. 6. Referring to FIG. 7A, four microlenses 3142 are disclosed, and the pixel array 3140 including four sub-pixels 3143 under each microlens 3142 is disclosed. Referring to FIG. 7A, the pixel array 3140 that may include a blocking member BM on the sub-pixel 3143 corresponding to the left region of the microlens 3142 is illustrated. In FIG. 7A, an example in which the blocking member BM is included only in the upper portion of the sub-pixel 3143 corresponding to the left region of the microlens 3142 is illustrated, but the present disclosure is not limited thereto. In the pixel array 3140 according to an example, the blocking member BM may be included only in the upper portion of the sub-pixel corresponding to the right region of the microlens 3142. According to an example, although four unit pixels 3141 are illustrated in the pixel array 3140 of FIG. 7A, the inventive concept may not be limited thereto. According to an example, the pixel array 3140 of FIG. 7A may include one unit pixel 3141.

Referring to FIG. 7A, it is illustrated that the blocking member BM is disposed on the upper portion of the microlens 3142, but this is exaggerated to explain the arrangement position of the blocking member BM, and the blocking member BM may be disposed under the microlens 3142.

Referring to FIG. 7B, a circuit diagram of a region corresponding to some pixel regions in the pixel array 3140 of FIG. 7A is shown. Referring to FIG. 7B, first to fourth photodiodes $PD_1$ to $PD_4$ disposed under a first microlens 3142*a*, and fifth to eighth photodiodes $PD_5$ to $PD_8$ disposed under a second microlens 3142*b* are shown. The blocking member BM may be disposed in the left region of the first microlens 3142*a* and the second microlens 3142*b*. Accordingly, the photodiodes $PD_1$ and $PD_3$ of the sub-pixel of the left region of the first microlens 3142*a*, and the photodiodes $PD_5$ and $PD_7$ of the sub-pixel of the left region of the second microlens 3142*b* may be blocked by the blocking member BM.

Referring to FIG. 7B, the photodiodes $PD_2$, $PD_4$, $PD_6$, and $PD_8$ of the sub-pixel of the right region of the first microlens 3142*a* and the second microlens 3142*b* may be electrically connected to a transfer circuit TC. This configuration enables only the overflow charge from the sub-pixels facing the same direction, e.g., the right direction, to be stored. In the example of FIG. 7B, the overflow gate transistor may not be included. Even without an overflow gate transistor, the overflow charge may be stored in the overflow capacitor OFC by controlling the reset signal applied to the reset transistor RG and the transfer control signal applied to transfer transistors $TG_2$, $TG_4$, $TG_6$, and $TG_8$ of transfer transistors $TG_1$ to $TG_8$. In FIG. 7B, FD1' to FD3' correspond to first to third floating diffusion nodes.

FIG. 7C is a cross-sectional view taken along the line I-I' of FIG. 7A. In the cross-sectional view of FIG. 7C, certain components may not be illustrated.

Referring to FIG. 7C, a blocking member BM may be disposed between the microlens 3142 and the photodiode $PD_1$. The blocking member BM may be disposed below the left region of the microlens 3142. The blocking member BM may be a member made of a material capable of blocking light. According to an example, the blocking member BM may be disposed between the photodiode $PD_1$ and the microlens 3142 in the form of a layer.

Figure 8A:
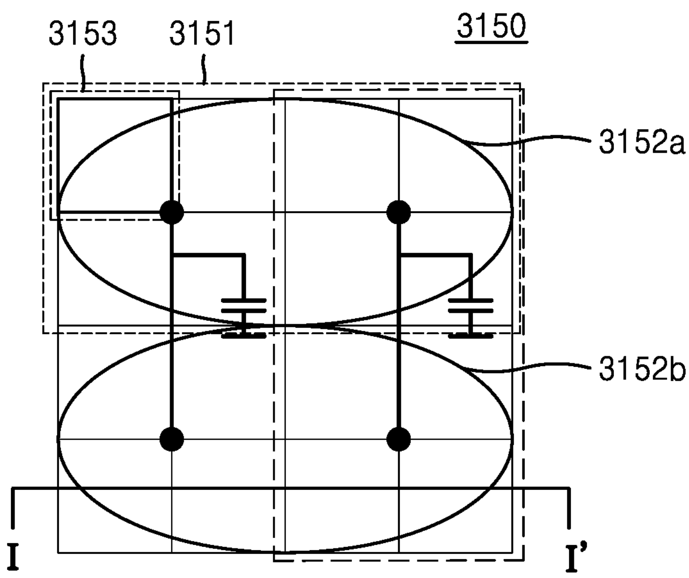
FIGS. 8A, 8B and 8C are diagrams illustrating a plan view, a circuit diagram, and a cross-sectional view of a pixel array according to an embodiment of the inventive concept.
Figure 8B:
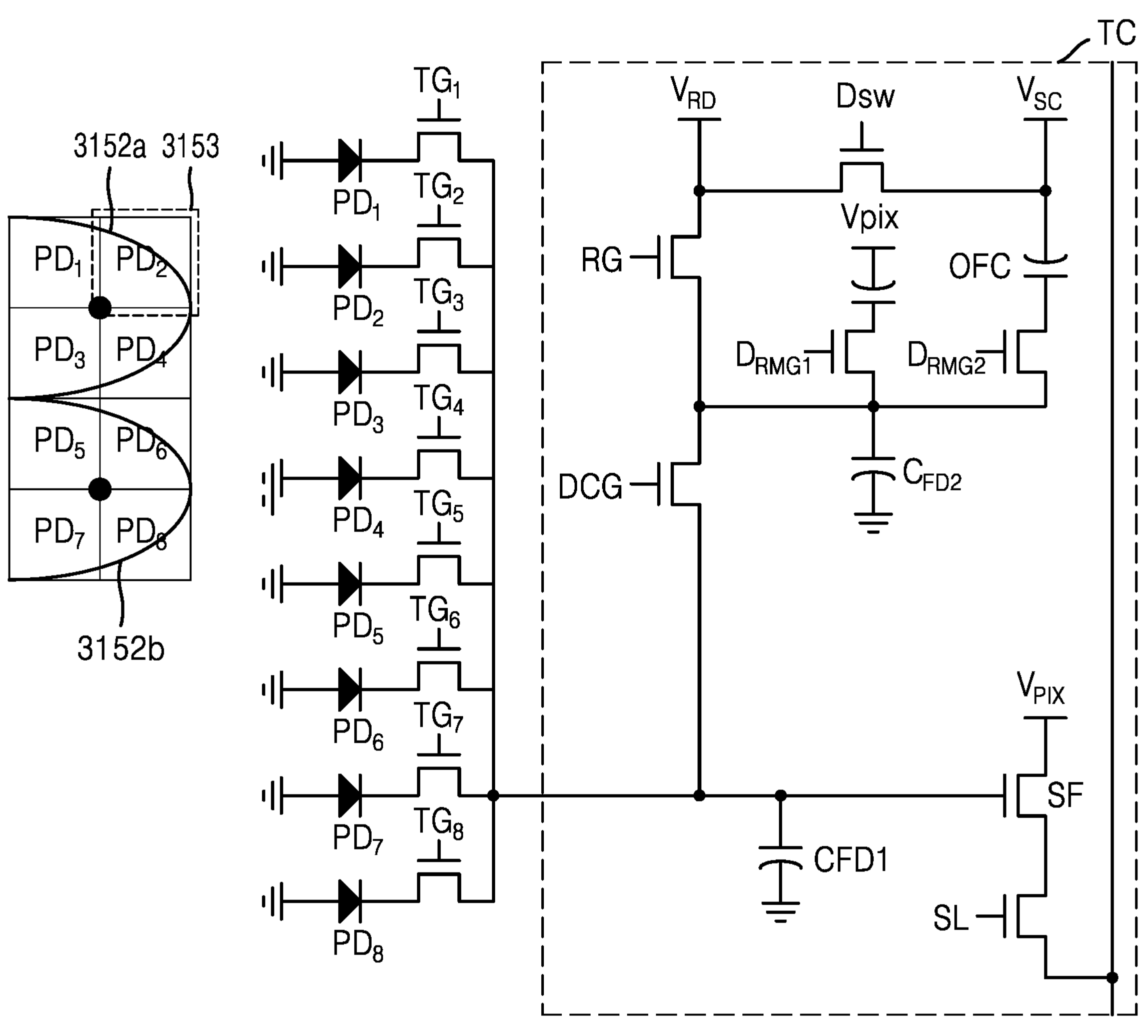
Figure 8C:
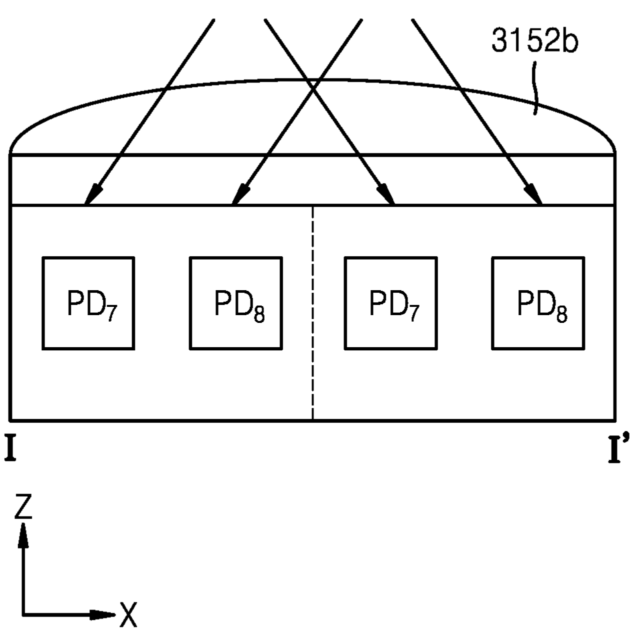

FIGS. 8A to 8C are diagrams illustrating a structure, a circuit diagram, and a cross-sectional view of a pixel according to an embodiment of the inventive concept.

A unit pixel 3151 included in the pixel array 3150 of FIG. 8A may correspond to the second AF pixel 315 of FIG. 6.

Referring to FIG. 8A, the pixel array 3150 may include two microlenses 3152*a* and 3152*b*. According to one example, the unit pixel 3151 included in the pixel array 3150 may include 8 sub-pixels 3153 in a region corresponding to one microlens 3152*a* and 3152*b*, respectively. The number of sub-pixels included in a region corresponding to one microlens in FIG. 8A may be greater than that of the embodiment of FIG. 7A.

Referring to FIG. 8A, the number of sub-pixels included in a region corresponding to the left region of one microlens 3152*a* may be four. The number of sub-pixels included in a region corresponding to the right region of one microlens 3152*a* may be four. For comparison purposes, the number of sub-pixels included in a region corresponding to the left region of the microlens 3142 of FIG. 7A may be two.

Referring to FIG. 8A, in the unit pixel 3151, the number of sub-pixels occupied by the left region and the right region of one microlens may be greater than that of the unit pixel 3141 of FIG. 7A. The size of the microlens disposed in the unit pixel 3151 of FIG. 8A may be greater than the size of the microlens disposed in the unit pixel 3141 of FIG. 7A.

FIG. 8B is a diagram illustrating a circuit diagram of a right region of the pixel array of FIG. 8A.

Referring to FIG. 8B, the right region of the pixel array 3150 of FIG. 8A may include a total of eight sub-pixels 3153. According to an example, each of the sub-pixels 3153 included in the right region of the pixel array 3150 of FIG. 8A may include a photodiode. According to an example, the right region of the pixel array 3150 of FIG. 8A includes 8 sub-pixels 3153, and a circuit diagram including 8 photodiodes $PD_1$ to $PD_8$ is disclosed.

Referring to FIG. 8B, eight photodiodes $PD_1$ to $PD_8$ may be connected to transfer transistors $TG_1$ to $TG_8$, respectively. According to an example, all of the eight photodiodes $PD_1$ to $PD_8$ of FIG. 8B may be photodiodes included in the sub-pixels 3153 corresponding to the right region of the microlenses 3152*a* and 3152*b*. Therefore, if all the overflowed charges of the eight photodiodes $PD_1$ to $PD_8$ are connected to the transfer circuit TC, this eliminates the need for an additional connection to a separate circuit or a separate overflow capacitor, unlike the previous embodiment.

FIG. 8C is a cross-sectional view of the pixel array 3150 of FIG. 8A. In the cross-sectional view of FIG. 8C, components may be omitted. Referring to FIG. 8C, a cross-sectional view in which photodiodes $PD_7$, $PD_8$, $PD_7$, and $PD_8$ are respectively disposed under the microlens 3152*b* is disclosed. According to one example, a length in the X-axis direction of the microlens 3152*b* may be longer than a length in the X-axis direction of the microlens 3142 of FIG. 7C. Referring to FIG. 8C, through the use of a wider microlens 3152*b* in the X-axis direction, the number of photodiodes disposed in the left or right direction of the microlens 3152*b* may be greater.

According to an example as shown in FIG. 4B, in the circuit diagram of a 2×4 unit pixel, two separate transfer circuits may be needed to separate the left and right sides of the 8 photodiodes and connect the 8 photodiodes to the overflow capacitor. In the circuit diagram of a 2×4 unit pixel having a long X-axis direction of a microlens as shown in FIGS. 8A to 8C, there is no need to separate the left and right sides of the 8 photodiodes, so the overflow charge may be saved by using just one transfer circuit.

Figure 9A:
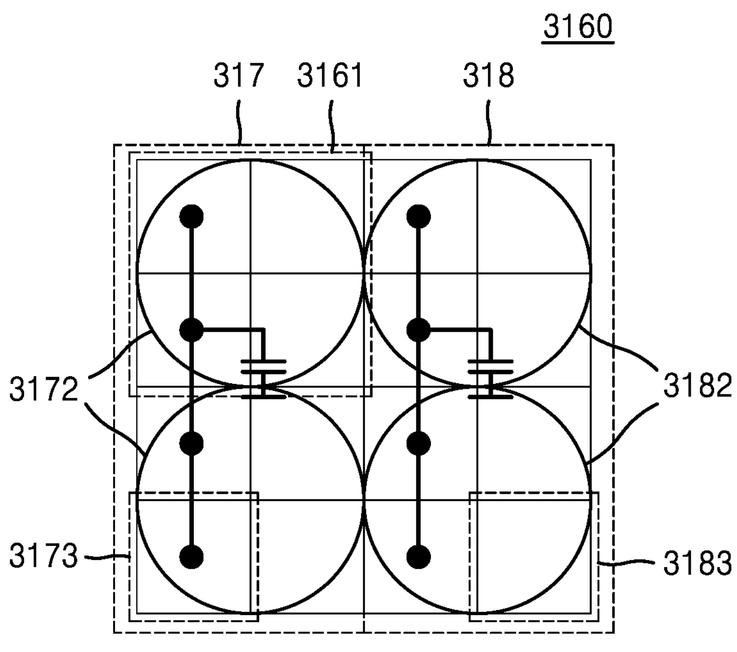
FIGS. 9A, 9B and 9C are diagrams illustrating a plan view and a circuit diagram of a pixel array according to an embodiment of the inventive concept.
Figure 9B:
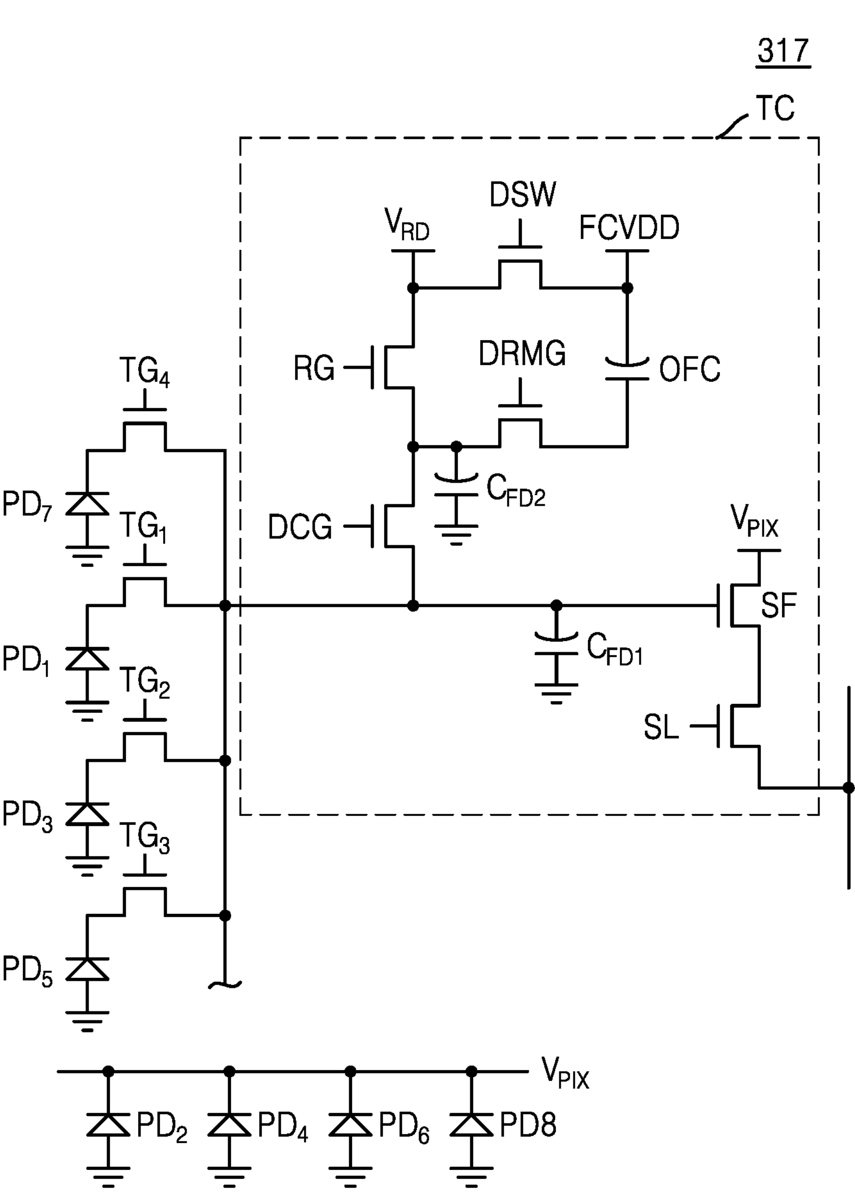
Figure 9C:
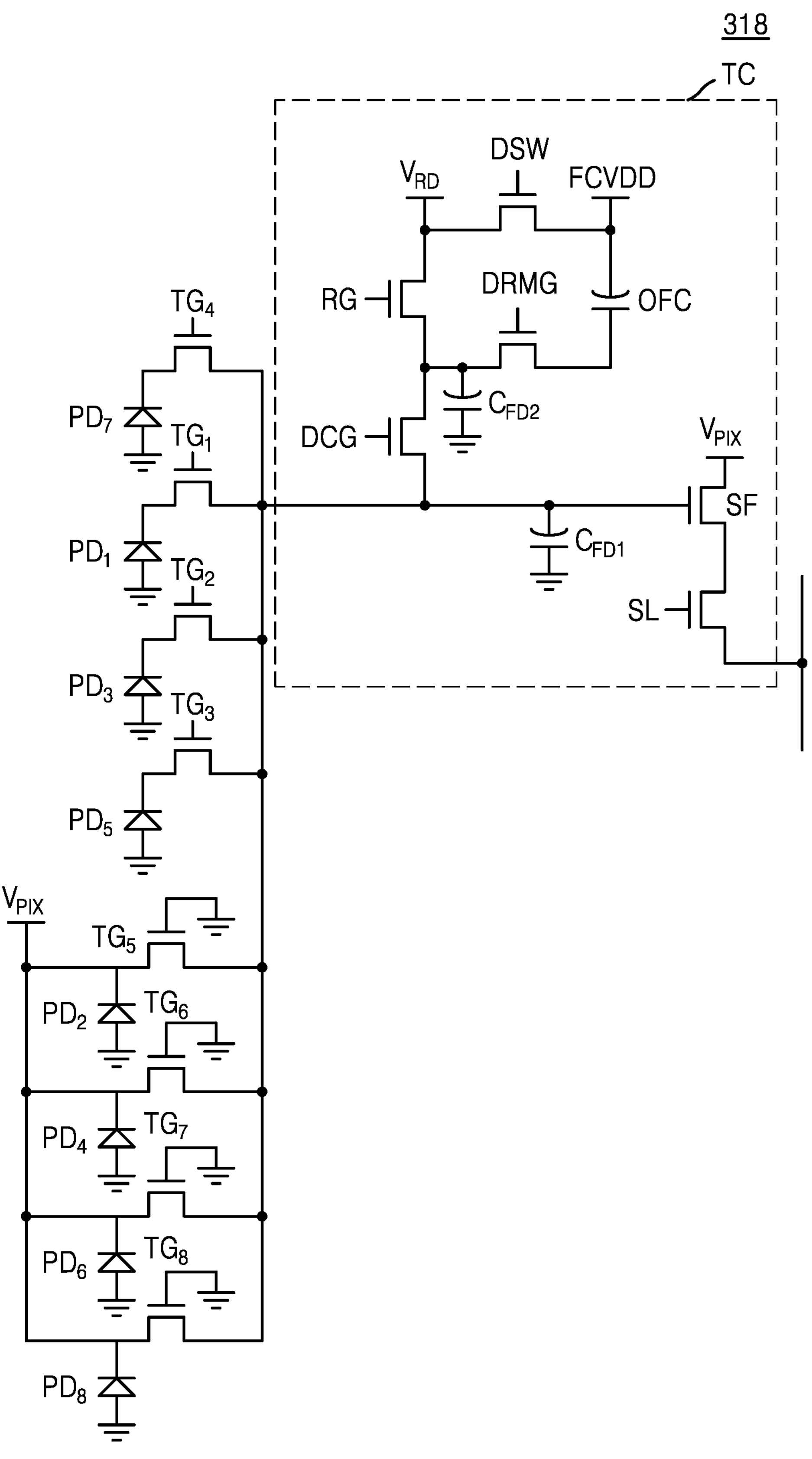

FIGS. 9A to 9C are diagrams illustrating the structure and circuit diagram of a pixel according to an embodiment of the inventive concept.

The unit pixel 3161 included in the pixel array 3160 of FIG. 9A may correspond to the third AF pixel 316 of FIG. 6. The pixel array 3160 of FIG. 9A may include a first pixel region 317 and a second pixel region 318. According to an example, the first pixel region 317 and the second pixel region 318 may be a 2×4 unit pixel. Referring to FIG. 9A, the first pixel region 317 may include two microlenses 3172, and sub-pixels corresponding to the left region of the two microlenses 3172 are connected to each other and may be connected to an overflow capacitor OFC. Referring to FIG. 9A, sub-pixels corresponding to the right region of the two microlenses 3172 in the first pixel region 317 may not be connected to each other. This will be described in more detail with reference to FIGS. 9B and 9C.

FIG. 9B is an example of a circuit diagram corresponding to the pixel region shown in FIG. 9A. The configuration of the circuit diagram of FIG. 9B may be an example, and one configuration of a circuit including a capacitor capable of storing overflowed charges may be applied.

The number of sub-pixels 3173 included in the first pixel region 317 of FIG. 9A may be eight. Referring to FIG. 9A, to store the overflow charge of only the sub-pixel corresponding to the left region of the microlens 3172 among the sub-pixels 3173 included in the first pixel region 317, the transfer transistor connected to the photodiode included in the sub-pixel corresponding to the right region of the microlens 3172 among the sub-pixels 3173 included in the first pixel region 317 may be removed.

Referring to FIG. 9B, the photodiodes $PD_1$, $PD_3$, $PD_5$, and $PD_7$ may be connected to the transfer transistors $TG_1$ to $TG_4$, respectively. The photodiodes $PD_1$, $PD_3$, $PD_5$, and $PD_7$ may be photodiodes included in each of the sub-pixels corresponding to the left region of the microlens 3172 among the sub-pixels included in the first pixel region 317. The photodiodes $PD_2$, $PD_4$, $PD_6$, and $PD_8$ may be photodiodes included in each of sub-pixels corresponding to the right region of the microlens 3172 among sub-pixels included in the first pixel region 317. The photodiodes $PD_2$, $PD_4$, $PD_6$, and $PD_8$ included in each of the sub-pixels corresponding to the right region of the microlens 3172 may be respectively connected to the pixel voltage VW. The photodiodes $PD_2$, $PD_4$, $PD_6$, and $PD_8$ included in each of the sub-pixels corresponding to the right region of the microlens 3172 may not be connected to the transfer transistor. Through such a structure, charges passing through the sub-pixels corresponding to the right region of the microlens 3172 may not be electrically connected to the transfer circuit TC.

FIG. 9C is an example of a circuit diagram corresponding to the pixel region shown in FIG. 9A. The configuration of the circuit diagram of FIG. 9C may be an example, and one configuration of a circuit including a capacitor capable of storing overflowed charges may be applied.

In the embodiment of FIG. 9C, descriptions of the same features as those of FIG. 9B will be omitted. In the embodiment of FIG. 9C, the structure of the transfer circuit TC may be the same as that of FIG. 9B. Referring to FIG. 9C, among sub-pixels 3183 included in the second pixel region 318, a photodiode included in each of the sub-pixels corresponding to the left region of the microlens 3182 may be $PD_1$, $PD_3$, $PD_5$, or $PD_7$. Referring to FIG. 9C, among sub-pixels 3183 included in the second pixel region 318, a photodiode included in each of the sub-pixels 3183 corresponding to the right region of the microlens 3182 may be $PD_2$, $PD_4$, $PD_6$, or $PD_8$.

Referring to FIG. 9C, the photodiodes $PD_2$, $PD_4$, $PD_6$, and $PD_8$ may be connected to transfer transistors $TG_5$ to $TG_8$, respectively. According to the embodiment of FIG. 9C, gates of the transfer transistors $TG_5$ to $TG_8$ may be connected to a ground GND. The photodiodes $PD_2$, $PD_4$, $PD_6$, and $PD_8$ included in each of the sub-pixels corresponding to the right region of the microlens 3182 among the sub-pixels 3183 included in the second pixel region 318 may be respectively connected to the pixel voltage $V_{PIX}$. Through this structure, the photodiodes $PD_2$, $PD_4$, $PD_6$, and $PD_8$ included in the sub-pixels 3183 corresponding to the right region of the microlens 3182 are connected to the transfer transistors $TG_5$ to $TG_8$, but gates of the transfer transistors $TG_5$ to $TG_8$ may be connected to the ground and may not be electrically connected to the transfer circuit TC.

According to one example, in FIGS. 9B to 9C, photocharges and overflow charges of the photodiodes $PD_2$, $PD_4$, $PD_6$, and $PD_8$ included in the regions corresponding to the right regions of the microlenses 3172 and 3182 may be drained as the pixel voltage $V_{PIX}$ of the AF pixel.

Referring to FIGS. 9A to 9C, although the first pixel region 317 and the second pixel region 318 included in the pixel array 3160 have different circuit structures, this is for convenience of description, and the inventive concept may not be limited thereto. The first pixel region 317 and the second pixel region 318 included in the pixel array 3160 may have the same circuit structure.

Referring to FIG. 6, some of the pixels included in the pixel array 310 may have a different structure from other pixels to be used for AF purposes. Referring to FIGS. 7A to 7C, an example of an AF pixel array 3140 that may include a blocking member is illustrated. Referring to FIGS. 8A to 8C, an example of an AF pixel array 3150 including a microlens having a large width in the X-axis direction is illustrated. Referring to FIGS. 9A to 9C, an example of the AF pixel array 3160 having a structure in which only the photodiodes connected to either side of the microlens are partially connected to the overflow capacitor, or electrons of some photodiodes do not flow into the overflow capacitor is illustrated.

Figure 10:
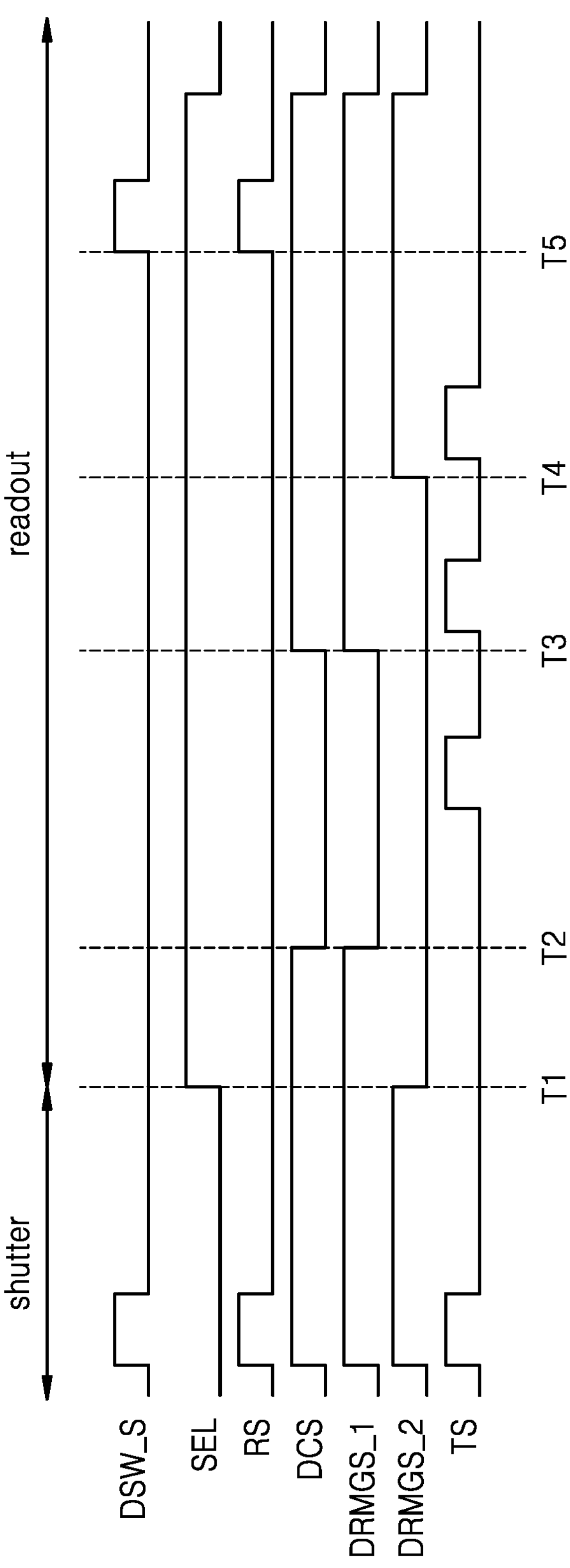
FIG. 10 is a timing diagram for explaining an operation of an auto focusing (AF) pixel included in a pixel array according to an embodiment of the inventive concept.

FIG. 10 is a timing diagram for explaining an operation of an AF pixel included in a pixel array according to an embodiment of the inventive concept.

In detail, FIG. 10 is a timing diagram illustrating an operation of an AF pixel included in the pixel array 3140 of FIG. 7A. According to an example, signals to be described in the timing diagram shown in FIG. 10 may be signals applied to transistors included in the transfer circuit TC shown in FIG. 7B and the transfer transistor TG. Signals to be described in the timing diagram shown in FIG. 10 may be a DCG control signal DCS for controlling the DCG transistor shown in FIG. 7B, a DRMG1 control signal DRMGS_1 for controlling the DRMG1 transistor, a DRMG2 control signal DRMGS_2 for controlling the DRMG2 transistor, a transfer control signal TS for controlling the pixel transfer transistors $TG_1$ to $TG_8$, a reset control signal RS for controlling the reset transistor RG, a selection signal SEL for controlling the selection transistor SL, and a DSW control signal DSW_S for controlling the DSW transistor DSW connected to one end of the DRAM capacitor OFC. In the illustrative example of the following timing diagram, one transfer control signal TS is provided, but a plurality of transfer control signals equal to the number of a plurality of transfer transistors may be provided. In the timing diagram of FIG. 10, one transfer control signal TS is shown for convenience of explanation, and it is assumed that the transfer control signal TS may turn on/off the transfer transistor TG connected to the transfer control signal TS line, and there is a photodiode PD connected to the transfer transistor TG.

The AF pixel included in the pixel array 3140 may reset the photodiode PD, the first to third floating diffusion nodes FD1', FD2', and FD3', and the overflow floating diffusion node OFD' during a shutter section and may read out pixel signals from the photodiode PD during a readout section. Hereinafter, operations performed in the shutter section and the readout section will be described.

First, in the shutter section, the DCG control signal DCS may transition from a first level (e.g., logic low) to a second level (e.g., logic high), and the DRMG1 control signal DRMGS_1 and the DRMG2 control signal DRMGS_2 may transition from the first level to the second level. Accordingly, the DCG transistor DCG, the DRMG1 transistor DRMG1 and the DRMG2 transistor DRMG2 may be turned on, and the first floating diffusion node FD1' may be connected to the second floating diffusion node FD2', the third floating diffusion node FD3', and the overflow floating diffusion node OFD'.

When the DCG control signal DCS, the DRMG1 control signal DRMGS_1 and the DRMG2 control signal DRMGS_2 transition from the first level to the second level, the reset control signal RS and the transfer control signal TS may transition from the first level to the second level. Accordingly, the reset transistor RG and the transfer transistor TG may be turned on, and the photodiode PD, the first to third floating diffusion nodes FD1'-FD3', and the overflow floating diffusion node OFD' may be reset. In other words, the photodiode PD, the first to third floating diffusion nodes FD1' to FD3', and the overflow floating diffusion node OFD' may be connected to the pixel voltage $V_{PIX}$ terminal, and charges existing in the photodiode PD and the first to third floating diffusion nodes FD1' to FD3' are drained toward the pixel voltage $V_{PIX}$ such that the photodiode PD, the first to third floating diffusion nodes FD1' to FD3', and the overflow floating diffusion node OFD' may be reset.

The readout section starts at T1. At T1, the selection signal SEL may transition from the first level to the second level. In the readout section, the selection signal SEL may maintain the second level after being transitioned to the second level. In this state, when a large amount of light is incident on the photodiode PD, photoelectric conversion may occur in the photodiode PD. The photodiode PD may accumulate charge generated by the photoelectric conversion, and the charges accumulated in the photodiode PD from the time point T1 may exceed the gate potential barrier of the turned-off transfer transistor TG, causing an overflow. The overflowed charges may be transferred and accumulate in the first to third floating diffusion nodes FD1'-FD3' and the overflow floating diffusion node OFD'.

At T1, the DRMG2 control signal DRMGS_2 may transition from the second level to the first level. The DCG control signal DCS and the DRMG1 control signal DRMGS_1 may maintain the second level. Accordingly, the DRMG2 transistor DRMG2 may be turned off, and the DCG transistor DCG and the DRMG1 transistor DRMG1 may maintain an on state. Accordingly, the first floating diffusion node FD1', the second floating diffusion node FD2', and the third floating diffusion node FD3' may be connected to each other. The signal output at this time may refer to a reset signal in the low conversion gain mode.

At T2, the DCG control signal DCS and the DRMG1 control signal DRMGS_1 may transition from the second level to the first level. In this case, the DRMG2 control signal DRMSG_2 may maintain the first level. Accordingly, the DCG transistor DCG, the DRMG1 transistor DRMG1 and the DRMG2 transistor DRMG2 may be turned off, and the first floating diffusion node FD1', the second floating diffusion node FD2', and the third floating diffusion node FD3' may not be connected to each other. The signal output at this time may refer to a reset signal in the high conversion gain mode.

In a section between T2 and T3, a transfer control signal TS may transition from a first level to a second level. Accordingly, the transfer transistor TG may be turned on. In the section between time points T2 and T3, since the transfer transistor TG is turned on, and the DCG control signal DCS, the DRMG1 control signal DRMGS_1, and the DRMG2 control signal DRMGS_2 maintain the first level, the charges accumulated in the photodiode PD may be accumulated by moving to the first floating diffusion node FD1'. At this time, since the second floating diffusion node FD2', the third floating diffusion node FD3', and the overflow floating diffusion node OFD' are electrically cut off from the first floating diffusion node FD1', charges accumulated in the photodiode PD may not move. Thus, the AF pixel may operate in a high conversion gain mode. Subsequently, the transfer control signal TS may transition back from the second level to the first level. Accordingly, the transfer transistor TG may be turned off again.

At T3, the DCG control signal DCS and the DRMG1 control signal DRMGS_1 may transition from the first level to the second level, and the DRMG2 control signal DRMGS_2 may have the first level. Accordingly, the DCG transistor DCG and the DRMG1 transistor DRMG1 may be turned on, and the first floating diffusion node FD1', the second floating diffusion node FD2', and the third floating diffusion node FD3' may be connected to each other.

In a section between T3 and T4, a transfer control signal TS may transition from the first level to the second level. Accordingly, the transfer transistor TG may be turned on. In the section between T3 and T4, since the transfer transistor TG is turned on, the DCG control signal DCS and the DRMG1 control signal DRMGS_1 maintain the second level, and the DRMG2 control signal DRMGS_2 maintain the first level, the charges accumulated in the photodiode PD may be accumulated by moving to the first floating diffusion node FD1', the second floating diffusion node FD2', and the third floating diffusion node FD3'. Accordingly, the AF pixel may operate in the low conversion gain mode. Subsequently, the transfer control signal TS may transition back from the second level to the first level. Accordingly, the transfer transistor TG may be turned off again.

At T4, the DRMG2 control signal DRMGS_2 may transition from the first level to the second level. Accordingly, the DRMG2 transistor DRMG2 may be turned on, and the first floating diffusion node FD1, the second floating diffusion node FD2, the third floating diffusion node FD3, and the overflow floating diffusion node OFD' may be connected to each other.

In a section between T4 and T5, a transfer control signal TS may transition from the first level to the second level. Accordingly, the transfer transistor TG may be turned on. In the section between T4 and T5, since the transfer transistor TG is turned on, and the DCG control signal DCS, the DRMG1 control signal DRMGS_1, and the DRMG2 control signal DRMGS_2 maintain the second level, the charges accumulated in the photodiode PD move to the first floating diffusion node FD1, the second floating diffusion node FD2, the third floating diffusion node FD3, and the overflow floating diffusion node OFD' to accumulate therein.

At T5, the reset control signal RS may transition from the first level to the second level, and the DSW control signal DSW_S may transition from the first level to the second level. When the reset control signal RS transitions from the first level to the second level, the reset transistor RG may be turned on, and when the DSW control signal DSW_S transitions from the first level to the second level, the DSW transistor DSW may be turned on. Accordingly, the overflow floating diffusion node OFD' and one end of the reset transistor RG may be connected to each other.

Figure 11A:
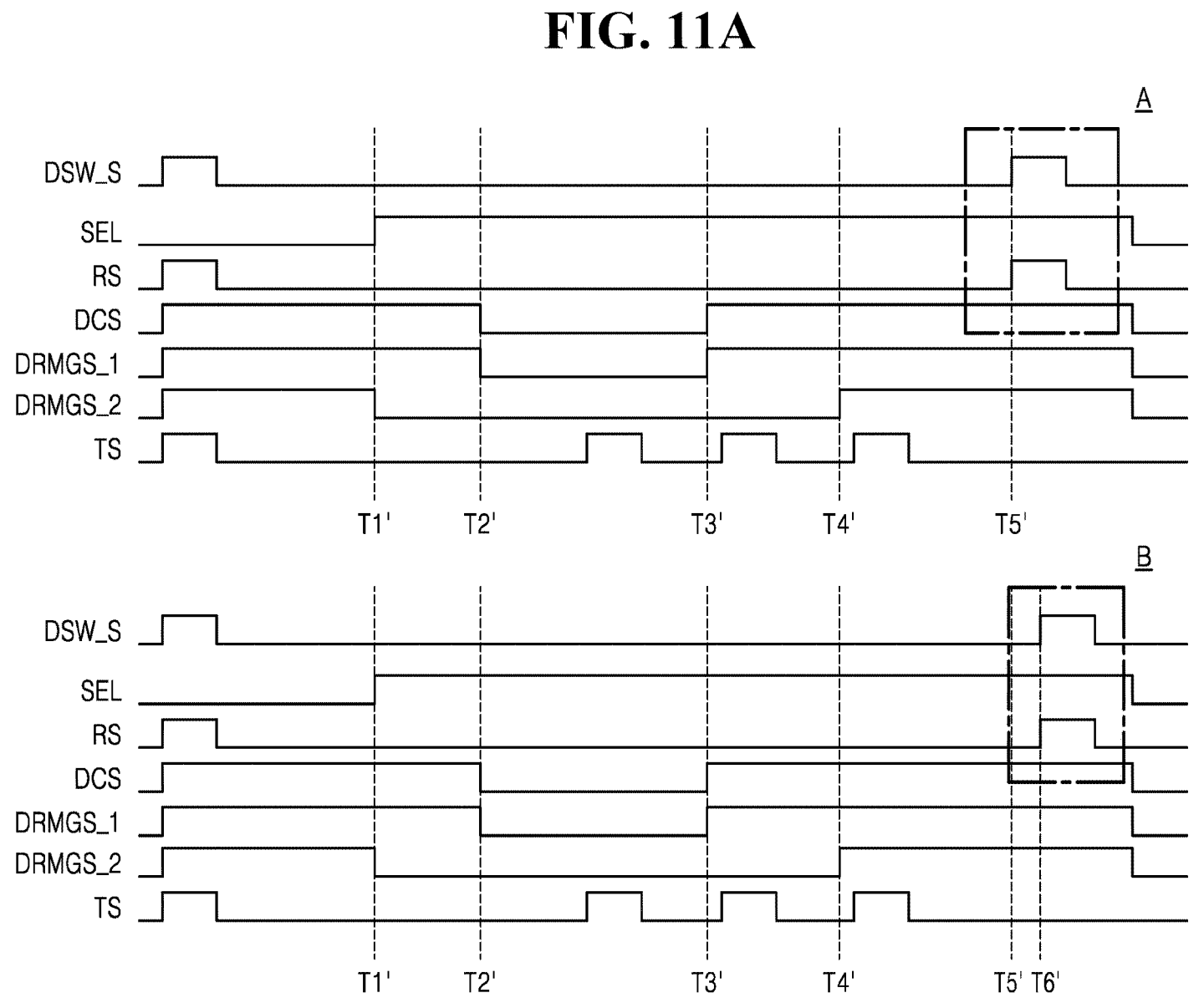
Figure 11B:
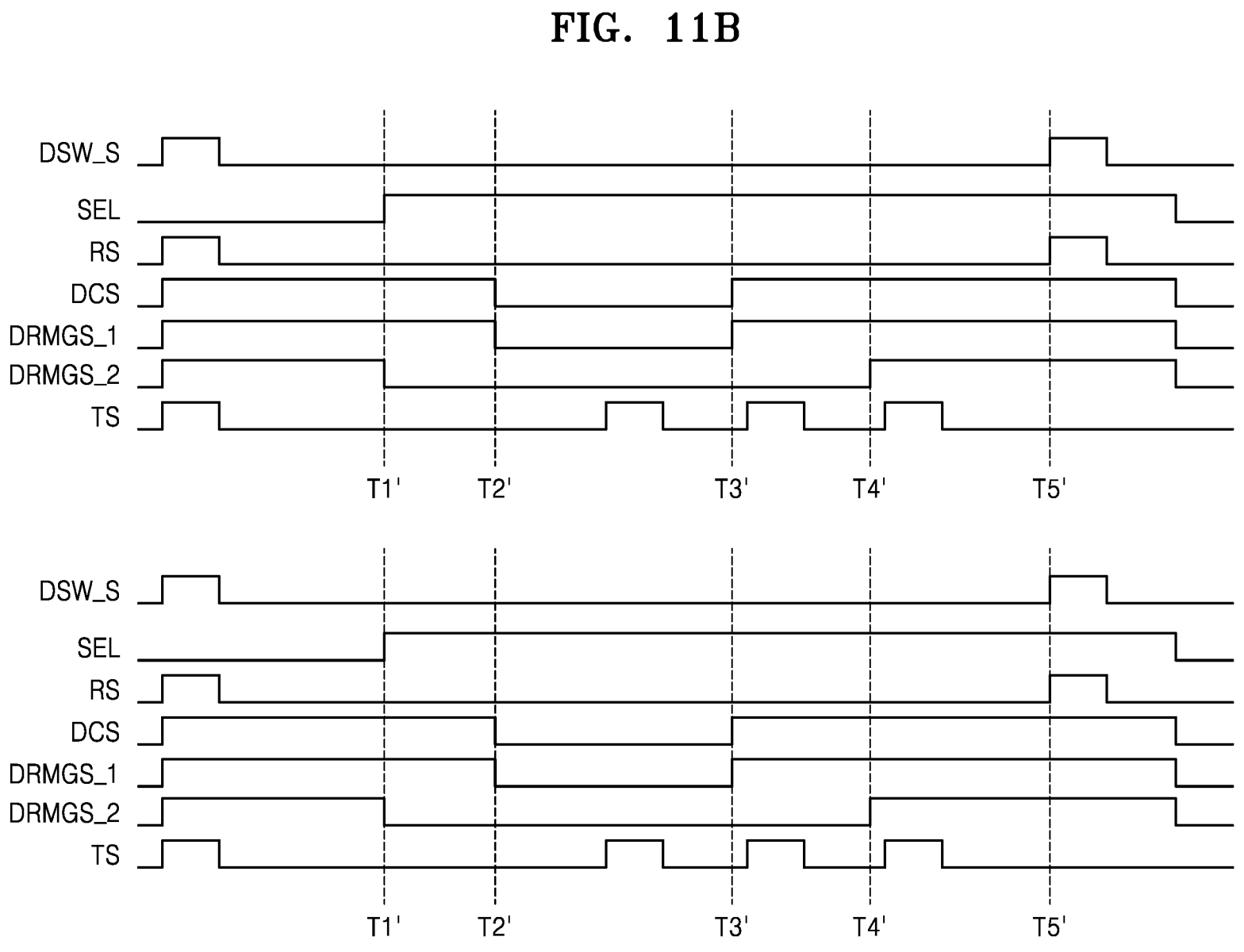

FIGS. 11A and 11B are timing diagrams for explaining the operation of an AF pixel according to an embodiment of the inventive concept. In FIGS. 11A and 11B, descriptions of portions overlapping with those described with reference to FIG. 10 will be omitted.

FIG. 11A is a diagram for explaining AF readout timing in the embodiment including full-scale AF pixels. According to an example, the full-scale AF pixel may be an AF pixel included in the pixel array shown in FIGS. 3A, 4A, and 5A. The two timing diagrams illustrated in FIG. 11A may refer to timing diagrams of signals applied to each of the full-scale AF pixels included in the pixel array. According to an example, the two timing diagrams illustrated in FIG. 11A may be timing diagrams corresponding to region A and region B illustrated in FIG. 4B, respectively.

Referring to FIG. 11A, readout timings of overflow capacitors in a pixel array including a full-scale AF pixel may be different from each other.

Referring to FIG. 11A, in a timing diagram of a circuit corresponding to the region A among full-scale AF pixels included in one pixel array, at the time point T5', the control signal DSW_S and the reset control signal RS may transition from the first level to the second level. In the timing diagram of the circuit corresponding to the region B among the full-scale AF pixels included in one pixel array, at the time point T6', the DSW control signal DSW_S and the reset control signal RS may transition from the first level to the second level. The time point T6' may occur after the time point T5'.

Referring to FIG. 11A, to maintain accuracy, the AF readout timing for pixels within a full-scale AF pixel may be controlled differently in cases where the difference between the left and right sub-pixels located under a single microlens is significant. This is because reading out the overflow capacitors of these pixels simultaneously may result in an increased error rate when calculating the output value FIG. 11B is a diagram for explaining AF readout timing in an embodiment of a separate AF pixel. According to an example, the separate AF pixels may be AF pixels illustrated in FIGS. 7A to 9C. The two timing diagrams illustrated in FIG. 11B may refer to timing diagrams of signals applied to the separate AF pixel. According to an example, the two timing diagrams illustrated in FIG. 11B may be timing diagrams of signals applied to each of two AF pixels among AF pixels included in the pixel array 3160 illustrated in FIG. 9A.

Referring to FIG. 11B, AF readout timings of pixels included in a separate AF pixel may be the same. Referring to FIG. 11B, since all the pixels included in the separate AF pixel have the same AF phase information, even if operating simultaneously, there is no interference between pixels. In this case, AF readout may be operated at the same time.

Referring to FIG. 11B, the DSW control signal DSW_S and the reset control signal RS may transition from the first level to the second level at the same time point T5' in both timing diagrams.

While the inventive concept has been particularly shown and described with reference to embodiments thereof, it will be understood that various changes in form and details may be made thereto without departing from the spirit and scope of the inventive concept as set forth in the following claims.

What is claimed is:

1. An image sensor comprising:

a plurality of first photoelectric conversion elements included in a first region of a unit pixel;

a plurality of second photoelectric conversion elements included in a second region of the unit pixel;

a first overflow capacitor connected to the plurality of first photoelectric conversion elements to store overflow charges of the first photoelectric conversion elements;

a second overflow capacitor connected to the plurality of second photoelectric conversion elements to store overflow charges of the second photoelectric conversion elements; and two or more microlenses disposed on the unit pixel, wherein the first region and the second region respectively correspond to a first side of two or more microlenses and a second side of two or more microlenses.

2. The image sensor of claim 1, wherein the first region corresponds to a left side of the two or more microlenses, wherein the second region corresponds to a right side of the two or more microlenses.

3. The image sensor of claim 1, further comprising:

a plurality of first overflow gate transistors respectively connected to the plurality of first photoelectric conversion elements; and a plurality of second overflow gate transistors respectively connected to the plurality of second photoelectric conversion elements.

4. The image sensor of claim 3, wherein the plurality of first overflow gate transistors are respectively connected between the plurality of first photoelectric conversion elements and the first overflow capacitor, wherein the plurality of second overflow gate transistors are respectively connected between the plurality of second photoelectric conversion elements and the second overflow capacitor.

5. The image sensor of claim 1, wherein the first overflow capacitor and the second overflow capacitor comprise dynamic random access memory (DRAM) capacitors.

6. An image sensor comprising a pixel array in which a plurality of pixels are arranged, wherein the pixel array comprises:

unit pixels each including a plurality of sub-pixels; and one or more auto focusing (AF) pixels including a first sub-pixel group and a second sub-pixel group of the plurality of sub-pixels, wherein one microlens is disposed above each of the one or more AF pixels, wherein first photodiodes corresponding to the first sub-pixel group included in the one or more AF pixels are electrically connected to a transfer circuit included in the one or more AF pixels, wherein the transfer circuit comprises an overflow capacitor for storing overflow charges of the photodiodes corresponding to the first sub-pixel group, and wherein a first region and a second region respectively correspond to a first side of the microlens and a second side of the microlens.

7. The image sensor of claim 6, wherein photodiodes corresponding to the second sub-pixel group included in the AF pixel are not electrically connected to a transfer circuit included in the AF pixel.

8. The image sensor of claim 7, further comprising a blocking member disposed between the second sub-pixel and the microlens.

9. The image sensor of claim 8, wherein the blocking member includes a light blocking material.

10. The image sensor of claim 7, wherein the photodiodes corresponding to the second sub-pixel group are connected to a pixel voltage and a ground voltage.

11. The image sensor of claim 7, wherein the photodiodes corresponding to the second sub-pixel group each comprise a plurality of transfer transistors connected thereto, wherein gates of the plurality of transfer transistors are connected to a ground voltage.

12. The image sensor of claim 11, wherein the photodiodes corresponding to the second sub-pixel group are connected to a pixel voltage and a ground voltage.

13. The image sensor of claim 7, wherein the first sub-pixel group is disposed on a left side of the microlens or a right side of the microlens, wherein the second sub-pixel group does not overlap the first sub-pixel group.

14. The image sensor of claim 6, wherein the number of sub-pixels overlapped by the microlens is 8.

15. The image sensor of claim 6, wherein the overflow capacitor comprises a dynamic random access memory (DRAM) capacitor.

16. An image sensor comprising a pixel array including one or more auto focusing (AF) pixels, wherein a microlens is disposed on the AF pixel, wherein the AF pixel comprises:

a plurality of photodiodes corresponding to a plurality of sub-pixels included in the AF pixel;

a plurality of transfer transistors configured to transfer photocharges of the plurality of photodiodes to a transfer circuit; and the transfer circuit including a plurality of overflow capacitors for storing overflow charges of the plurality of photodiodes, wherein first overflow charges of a photodiode included in a region corresponding to a first region of the microlens are stored in a first overflow capacitor of the plurality of overflow capacitors, wherein second overflow charges of a photodiode included in a region corresponding to a second region of the microlens stored in a second overflow capacitor of the plurality of overflow capacitors, and wherein the first overflow charges and the second overflow charges are processed independently of each other.

17. The image sensor of claim 16, wherein the transfer circuit comprises:

a first overflow gate transistor for controlling the overflow charges of the photodiode included in the region corresponding to the first region of the microlens; and a second overflow gate transistor for controlling the overflow charges of the photodiode included in the region corresponding to the second region of the microlens.

18. The image sensor of claim 16, wherein the photodiode included in the region corresponding to the first region of the microlens is electrically connected to the transfer circuit, wherein the photodiode included in the region corresponding to the second region of the microlens is electrically separated from the transfer circuit.

19. The image sensor of claim 18, wherein photoelectric charges and overflow charges of the photodiode included in the region corresponding to the second region of the micro-lens are drained as a pixel voltage of the AF pixel.

20. The image sensor of claim 16, wherein the overflow capacitor comprises a dynamic random access memory (DRAM) capacitor.

* * * * *